(12) United States Patent
Moon et al.

(10) Patent No.: US 12,096,646 B2
(45) Date of Patent: Sep. 17, 2024

(54) DISPLAY DEVICE AND ELECTRONIC DEVICE HAVING THE SAME

(71) Applicant: Samsung Display Co., Ltd., Yongin-si (KR)

(72) Inventors: Jeongwoo Moon, Suwon-si (KR); Kyoujong Park, Yongin-si (KR); Youngju Park, Cheonan-si (KR); JinYoung Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 416 days.

(21) Appl. No.: 17/344,847

(22) Filed: Jun. 10, 2021

(65) Prior Publication Data

US 2021/0305534 A1    Sep. 30, 2021

Related U.S. Application Data

(63) Continuation of application No. 16/595,333, filed on Oct. 7, 2019, now Pat. No. 11,038,143.

(30) Foreign Application Priority Data

Dec. 6, 2018 (KR) .......................... 10-2018-0155981

(51) Int. Cl.
*H10K 50/842* (2023.01)
*G02F 1/1333* (2006.01)
(Continued)

(52) U.S. Cl.
CPC ... *H10K 50/8426* (2023.02); *G02F 1/133308* (2013.01); *G02F 1/133502* (2013.01);
(Continued)

(58) Field of Classification Search
CPC ............. H10K 50/8426; H10K 50/856; H10K 50/868; H10K 50/858; H10K 50/86;
(Continued)

(56) References Cited

U.S. PATENT DOCUMENTS

| 9,690,024 B2 | 6/2017 | Jiao et al. |
| 10,031,265 B2 | 7/2018 | Kwon et al. |
| (Continued) | | |

FOREIGN PATENT DOCUMENTS

| CN | 104423700 A | 3/2015 |
| CN | 106297565 A | 1/2017 |
| (Continued) | | |

OTHER PUBLICATIONS

Extended European Patent Office Search Report for corresponding European Patent Application No. 19214031.7, dated Mar. 18, 2020, 8 pages.

(Continued)

*Primary Examiner* — Yasser A Abdelaziz
(74) *Attorney, Agent, or Firm* — Lewis Roca Rothgerber Christie LLP

(57) ABSTRACT

A display device includes a display module, a window disposed above the display module, an optical film disposed between the display module and the window, an adhesive layer, and a refractive index matching pattern. The window includes a base substrate and a bezel pattern overlapping with the base substrate and defining a first transmissive area and a second transmissive area isolated from the first transmissive area in a plane view. The optical film includes a first open area defined therein to correspond to the second transmissive area. The adhesive layer couples the window with the optical film. The refractive index matching pattern is disposed in the first open area and has a refractive index of about 90% to about 110% of the adhesive layer. The first open area is defined as an area in which the optical film is not disposed.

16 Claims, 35 Drawing Sheets

(51) Int. Cl.
    *G02F 1/1335*     (2006.01)
    *G02F 1/1339*     (2006.01)
    *H10K 50/80*     (2023.01)
    *H10K 50/856*     (2023.01)

(52) U.S. Cl.
    CPC ...... *G02F 1/133528* (2013.01); *G02F 1/1339* (2013.01); *H10K 50/856* (2023.02); *H10K 50/868* (2023.02)

(58) Field of Classification Search
    CPC ........ H10K 59/87; H10K 59/65; H10K 59/40; H10K 59/10; H10K 59/00; G02F 1/133308; G02F 1/133502; G02F 1/133528; G02F 1/1339; G09F 9/00; G02B 5/3025
    See application file for complete search history.

(56) References Cited

U.S. PATENT DOCUMENTS

| | | |
|---|---|---|
| 10,481,423 B2 | 11/2019 | Song et al. |
| 10,707,280 B2 | 7/2020 | Jeong et al. |
| 10,804,485 B2 | 10/2020 | Kwon et al. |
| 2013/0258234 A1 | 10/2013 | Park et al. |
| 2015/0123911 A1 | 5/2015 | Poliakov et al. |
| 2017/0012235 A1* | 1/2017 | Kwon .................. H10K 50/858 |
| 2017/0069871 A1* | 3/2017 | Yim ..................... H10K 50/844 |
| 2017/0125728 A1* | 5/2017 | Dighde ................ H10K 77/111 |
| 2017/0176246 A1 | 6/2017 | Jia et al. |
| 2017/0187934 A1 | 6/2017 | Kwak et al. |
| 2017/0287992 A1 | 10/2017 | Kwak et al. |
| 2017/0288002 A1* | 10/2017 | Kim ..................... H10K 77/111 |
| 2017/0324058 A1 | 11/2017 | Min |
| 2018/0308903 A1 | 10/2018 | Jeong et al. |
| 2018/0315357 A1* | 11/2018 | Nam ....................... G09F 13/22 |
| 2019/0064397 A1 | 2/2019 | Yun et al. |
| 2020/0124910 A1* | 4/2020 | Hwang ............. G02F 1/136209 |

FOREIGN PATENT DOCUMENTS

| | | |
|---|---|---|
| CN | 106340242 A | 1/2017 |
| CN | 108122489 A | 6/2018 |
| CN | 108735783 A | 11/2018 |
| KR | 10-2017-0077360 A | 7/2017 |
| KR | 10-2017-0110793 A | 10/2017 |
| KR | 10-2017-0111827 A | 10/2017 |

OTHER PUBLICATIONS

Chinese Office Action dated Oct. 8, 2022, including Search Report dated Sep. 26, 2022, for Application No. 201911238903.2, 17 pages.

* cited by examiner

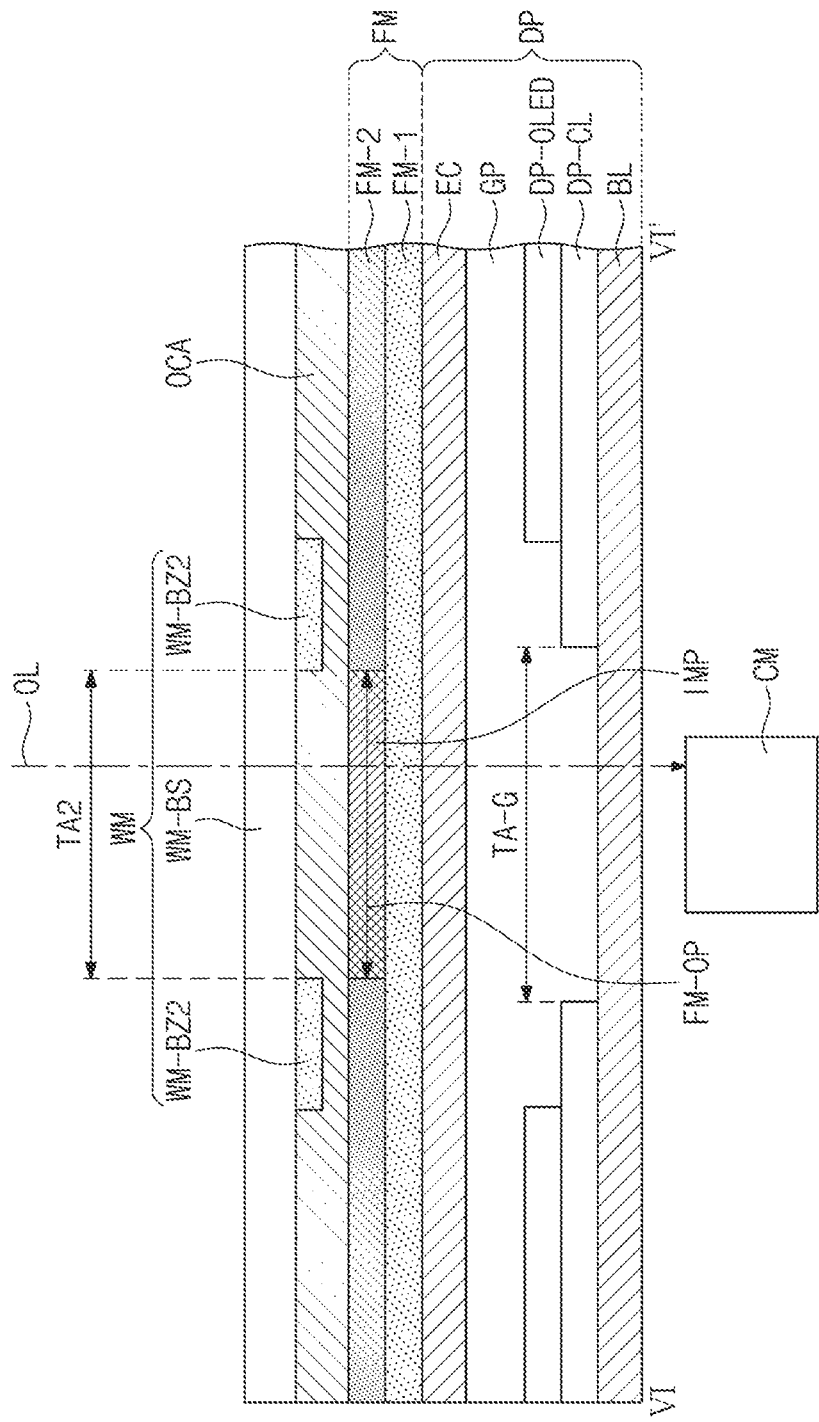

FIG. 14C

| | | |
|---|---|---|
| WM-BS | | |
| SL1 — SiNx(200Å) | SiNx(200Å) | SiNx(200Å) |
| SL2 — SiOx(200Å) | SiOx(200Å) | SiOx(200Å) |
| ARL1 SL3 — SiNx(900Å) | SiNx(900Å) | SiNx(900Å) |
| SL4 — SiOx(800Å) | SiOx(900Å) | SiOx(1,000Å) |

DISPLAY DEVICE AND ELECTRONIC DEVICE HAVING THE SAME

CROSS-REFERENCE TO RELATED APPLICATIONS

This application is a continuation of U.S. patent application Ser. No. 16/595,333, filed Oct. 7, 2019, which claims priority to and the benefit of Korean Patent Application No. 10-2018-0155981, filed Dec. 6, 2018, the entire content of both of which is incorporated herein by reference.

BACKGROUND

1. Field

The present disclosure relates to a display device and an electronic device including the same. More particularly, the present disclosure relates to a display device including a transmissive area through which an optical signal travels and an electronic device including the display device.

2. Description of the Related Art

In recent years, portable electronic devices have been in widespread use, and their functions are becoming increasingly diverse. Users prefer electronic devices having a wider display area and a narrower non-display area.

Various types (e.g., kinds) of electronic devices are being developed to reduce the area of the non-display area.

SUMMARY

An aspect according to embodiments of the present disclosure is directed toward a display device having a relatively wider display area and a relatively smaller non-display area.

An aspect according to embodiments of the present disclosure is directed toward an electronic device including the display device.

According to embodiments of the inventive concept, a display device includes a display module, a window on the display module, an optical film, an adhesive layer, and a refractive index matching pattern. The window includes a base substrate and a bezel pattern overlapping with the base substrate and defining a first transmissive area and a second transmissive area isolated from the first transmissive area in a direction parallel to a planar surface the base substrate. The optical film includes a first open area corresponding to the second transmissive area and is between the display module and the window. The adhesive layer couples the window and the optical film. The refractive index matching pattern is in the first open area and has a refractive index of about 90% to about 110% of a refractive index of the adhesive layer. The first open area is an area in which the optical film is not located.

The first transmissive area may have a surface area larger than a surface area of the second transmissive area, the first transmissive area is to transmit an image generated by the display module, and the second transmissive area is to transmit a natural light incident thereto from an outside or an infrared light reflected by an external object.

The optical film may include a polarizer and a retarder.

The base substrate may have a refractive index of about 1.48 to about 1.50, the adhesive layer may have a refractive index of about 1.46 to about 1.49, and the refractive index matching pattern may have a refractive index of about 1.45 to about 1.52.

The refractive index matching pattern may include a silicone resin, a urethane resin, an epoxy resin, and/or an acryl resin.

The refractive index matching pattern may have a thickness of about 50% to about 150% of a thickness of the optical film.

An upper surface of the refractive index matching pattern may be a curved surface having a convex shape or a concave shape.

The thickness of the refractive index matching pattern may be in a range of about 50% to about 150% of a thickness of the adhesive layer.

The base substrate may be a glass substrate, and the bezel pattern may be directly on a lower surface of the glass substrate.

The bezel pattern may include a first pattern extending along an edge of the base substrate and a second pattern extending from the first pattern to have a convex shape toward a center of the base substrate in a direction parallel to a planar surface of the base substrate.

The first transmissive area may be defined by an inner edge of the first pattern and an outer edge of the second pattern, and the second transmissive area may be defined by an inner edge of the second pattern.

The bezel pattern may include a first pattern extending along an edge of the base substrate and defining the first transmissive area and a second pattern spaced apart from the first pattern in a direction parallel to a planar surface of the base substrate, located inside the first pattern, and defining the second transmissive area.

A portion of an edge of the optical film may define the first open area, the bezel pattern may include a first pattern having a first width and a second pattern having a second width smaller than the first width, the second pattern may include an inner edge and an outer edge, and the portion of the edge of the optical film may overlap with the second pattern in a direction normal to the base substrate.

An edge of the refractive index matching pattern and the outer edge of the second pattern may satisfy the following Equation 1:

$$L1 \geq \left(LR = \frac{D1}{\tan(\theta 1)}\right).$$

In Equation 1, D1 denotes a distance between a lower surface of the base substrate and an upper surface of the optical film, θ1 is in a range of about 47° to about 70°, L1 denotes a distance between the outer edge of the second pattern and the edge of the refractive index matching pattern, and LR denotes a reference distance.

The edge of the optical film may include an outer edge and an inner edge separated from the outer edge and defining the first open area.

The display module may include a display panel for generating an image and an input sensor directly on an upper surface of the display panel.

The display panel may include a glass substrate, an encapsulation substrate on the glass substrate, a sealing member coupling the glass substrate and the encapsulation substrate and overlapping with the bezel pattern in a direction normal to the base substrate, a circuit element layer on the glass substrate and including a transistor, and a display element layer on the circuit element layer and including a light emitting device. A high transmittance area corresponding to the second transmissive area is defined in at least one of the circuit element layer and the display element layer, and the high transmittance area is defined as an area in which the transistor or the light emitting device is not located.

The input sensor may include a sensing electrode and a signal line connected to the sensing electrode, a second open area corresponding to the second transmissive area is defined in the sensing electrode, and the second open area is defined as an area in which a portion of the sensing electrode is not located.

The display device may further include an anti-reflective layer located on at least one of an upper surface of the display module and a lower surface of the base substrate.

According to embodiments of the inventive concept, an electronic device including a display device and a camera module is provided.

The display device includes a display module, a window on the display module, an optical film, an adhesive layer, and a synthetic resin pattern. The window includes a base substrate and a bezel pattern overlapping with the base substrate and defining a first transmissive area and a second transmissive area spaced from the first transmissive area on a front surface of the base substrate. The optical film includes an open area corresponding to the second transmissive area and is between the window and the display module. The synthetic resin pattern is in the open area and has a refractive index of about 90% to about 110% of a refractive index of the base substrate. The camera module overlaps with the display module and is to receive an optical signal after the optical signal passes through the second transmissive area and the synthetic resin pattern.

According to embodiments of the inventive concept, a display device includes a display module, a window on the display module, an optical film, an adhesive layer, and a synthetic resin pattern. The window includes a base substrate and a bezel pattern overlapping with the base substrate and defining a first transmissive area and a second transmissive area spaced from the first transmissive area on a front surface of the base substrate. The optical film includes an open area corresponding to the second transmissive area and is between the window and the display module. The adhesive layer couples the window and the optical film. The anti-reflective layer is on a lower surface of the display module, an upper surface of the display module, and a lower surface of the base substrate and overlaps with the open area in a direction normal to the base substrate. The open area is defined as an area in which the optical film is not located.

The anti-reflective layer may include a plurality of first inorganic layers having a first refractive index and a plurality of second inorganic layers having a second refractive index different from the first refractive index and alternately stacked with the first inorganic layers.

According to embodiments of the inventive concept, a display device comprises a display module, a window on the display module, an optical film between the window and the display module and having an open area overlapping the window, an adhesive layer coupling the window and the optical film, and a refractive index matching pattern in the open area. The refractive index matching pattern has a refractive index of about 90% to about 110% of a refractive index of the adhesive layer, the open area is an area in which the optical film is not located.

BRIEF DESCRIPTION OF THE DRAWINGS

The above and other features of the present disclosure will become readily apparent by reference to the following detailed description when considered in conjunction with the accompanying drawings, wherein:

FIGS. 8B-8D are cross-sectional views showing a display device according to an exemplary embodiment of the present disclosure;

FIG. 14C is a cross-sectional view showing anti-reflective layers according to an exemplary embodiment of the present disclosure.

DETAILED DESCRIPTION

Figure 1:
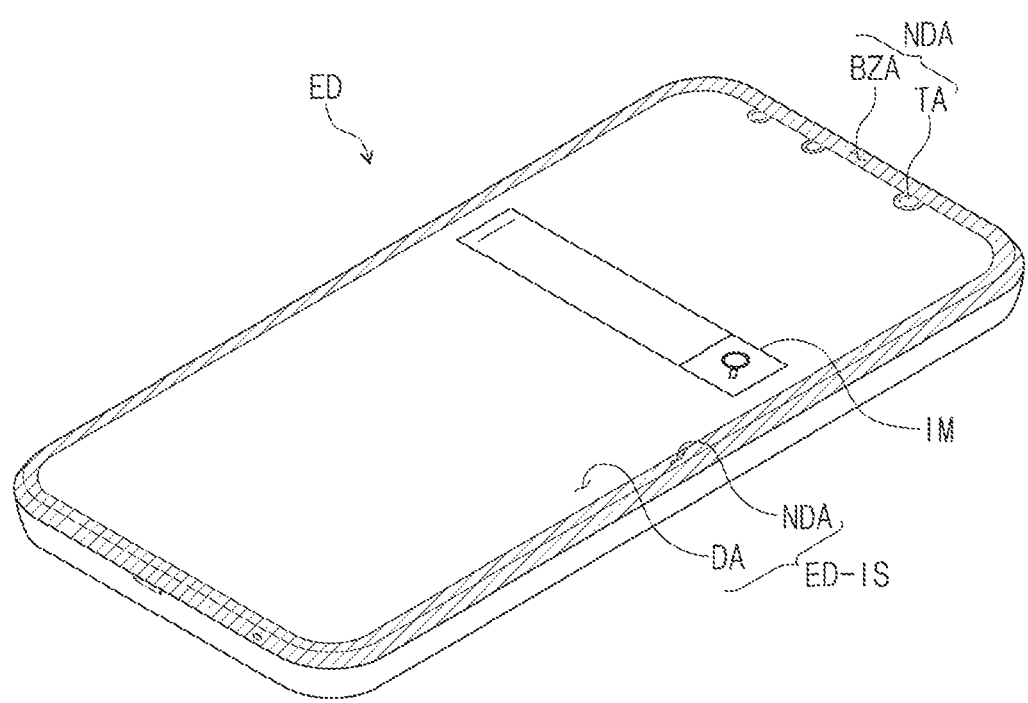
FIG. 1 is a perspective view showing an electronic device according to an exemplary embodiment of the present disclosure.
Figure 1:
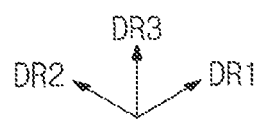

Like numerals refer to like elements throughout. In the drawings, the thickness, ratio, dimensions of components may be exaggerated for clarity. As used herein, the term "and/or" includes any and all combinations of one or more of the associated listed items.

It will be understood that, although the terms first, second, etc., may be used herein to describe various components, these components should not be limited by these terms. These terms are only used to distinguish one component from another component. Thus, a first component discussed below could be termed a second component without departing from the teachings of the present disclosure. Similarly, the second component could be termed the first component. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes", "including", "comprise", and/or "comprising", when used in this specification, specify the presence of stated features, integers, steps, operations, elements, components, and/or groups, but do not preclude the presence or addition of one or more other features, integers, steps, operations, elements, components, and/or groups thereof.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration. It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present. As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

Figure 2:
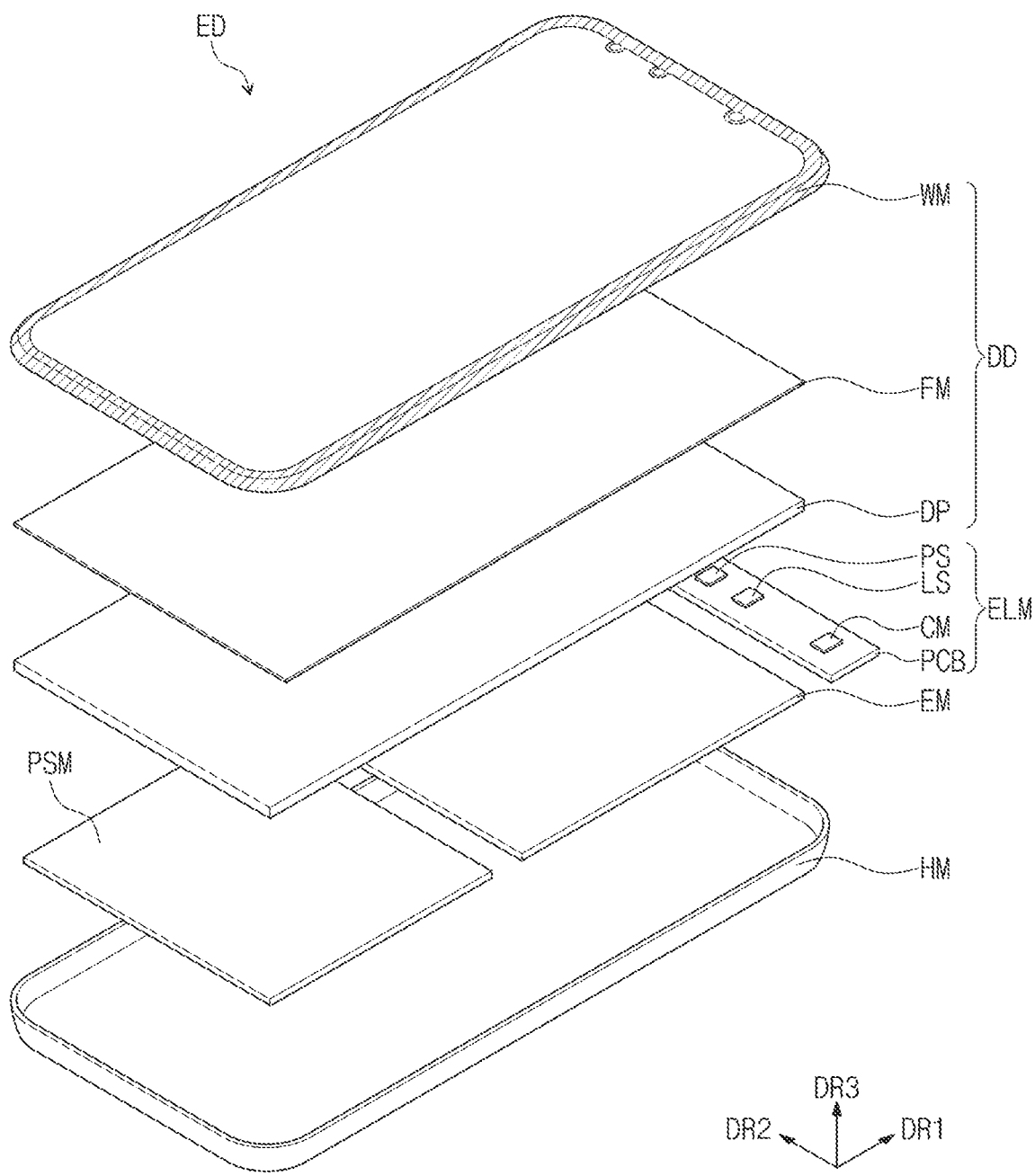
FIG. 2 is an exploded perspective view showing an electronic device according to an exemplary embodiment of the present disclosure.
Figure 3:
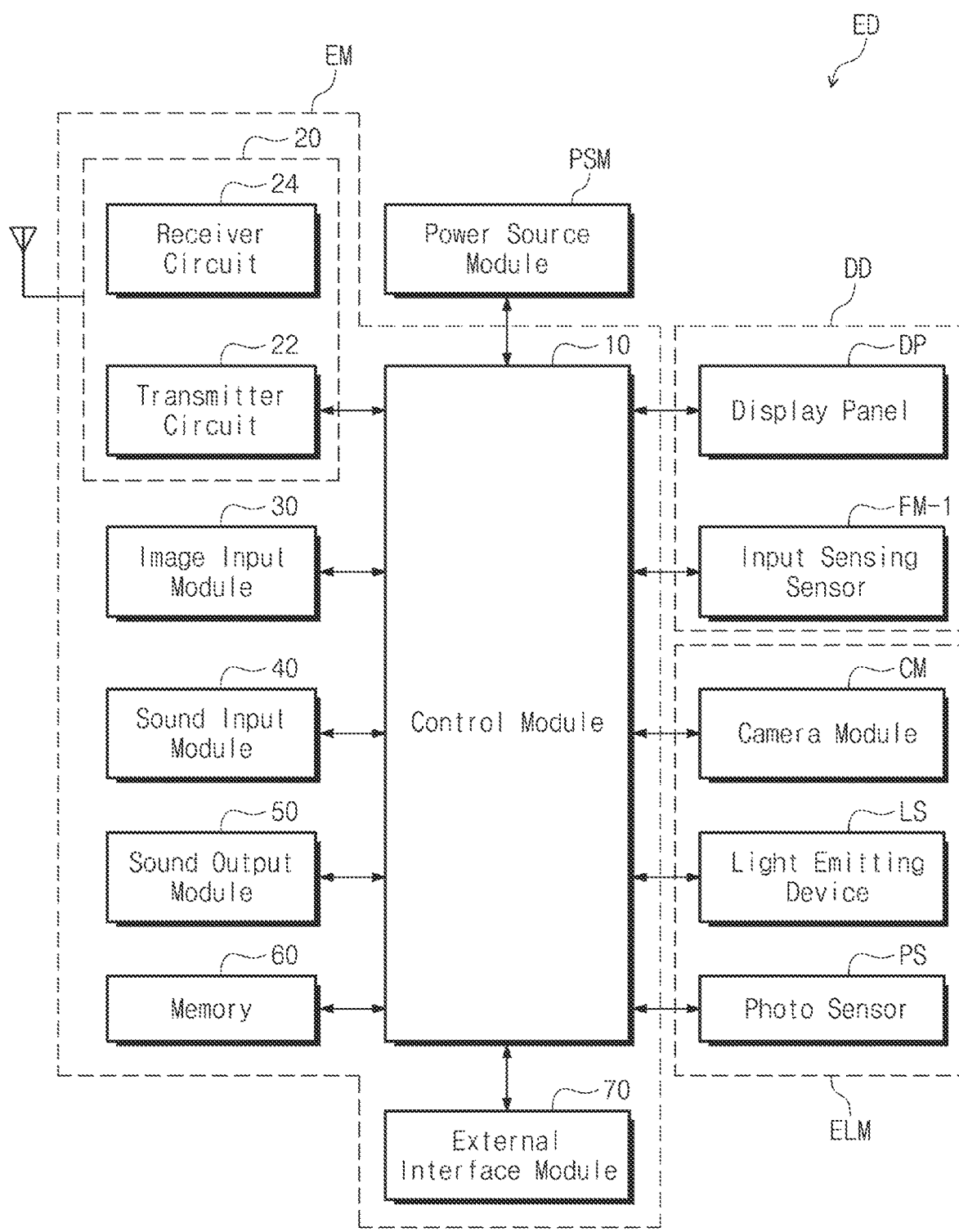
FIG. 3 is a block diagram showing an electronic device according to an exemplary embodiment of the present disclosure.

FIG. 1 is a perspective view showing an electronic device ED according to an exemplary embodiment of the present disclosure. FIG. 2 is an exploded perspective view showing the electronic device ED according to an exemplary embodiment of the present disclosure. FIG. 3 is a block diagram showing the electronic device ED according to an exemplary embodiment of the present disclosure.

Referring to FIG. 1, the electronic device ED displays an image IM through a display surface ED-IS. The display surface ED-IS is substantially parallel to a surface defined by a first directional axis DR1 and a second directional axis DR2. A third directional axis DR3 indicates a normal direction (e.g., normal line direction or a perpendicular direction) of the display surface ED-IS, i.e., a thickness direction of the electronic device ED. The display surface ED-IS of the electronic device ED corresponds to an exterior (e.g., exterior surface) of the electronic device ED and corresponds to an upper surface of a window WM.

Front (or upper) and rear (or lower) surfaces of each member or each unit described below are distinguished from each other by the third directional axis DR3. However, directions indicated by the first, second, and third directional axes DR1, DR2, and DR3 are merely exemplary. Hereinafter, the first, second, and third directions respectively correspond to directions indicated by the first, second, and third directional axes DR1, DR2, and DR3 and are assigned with the same reference numerals as the first, second, and third directional axes DR1, DR2, and DR3.

The display surface ED-IS includes a display area DA and a non-display area NDA disposed adjacent to the display area DA. The image IM is not displayed through the non-display area NDA. The non-display area NDA includes a bezel area BZA and a transmissive area TA. The bezel area BZA is an area that blocks an optical signal, and the transmissive area TA is an area that transmits the optical signal. Three transmissive areas TA are shown as a representative example. In the present exemplary embodiment, the optical signal may be an external natural light received by a camera module CM (refer to FIG. 2) and/or may be an infrared light generated by a light emitting device LS (refer to FIG. 2).

In the present exemplary embodiment, the non-display area NDA surrounds the display area DA. However, embodiments of the present disclosure are not limited thereto or thereby. It is sufficient that the non-display area NDA is disposed adjacent to one side of the display area DA. The non-display area NDA may be disposed only at an upper or lower side of FIG. 1. That is, the non-display area NDA may be disposed only at an upper or lower side of the display area DA along the first direction DR1.

In the present exemplary embodiment, the display surface ED-IS having a flat shape is shown as a representative example. However, according to another embodiment, a curved surface area may be disposed at both sides of the display surface ED-IS, which face each other in the second direction DR2, along an edge extending in the first direction DR1.

In the present exemplary embodiment, a mobile phone is shown as a representative example. However, the electronic device according to the present disclosure is not limited to the mobile phone. That is, the electronic device may be embodied as various suitable information providing devices, such as a television set, a navigation unit, a computer monitor, and/or a game unit.

Referring to FIGS. 2 and 3, the electronic device ED may include a display device DD, an electronic module EM, an electronic optical module ELM, a power source module PSM, and a housing HM.

The display device DD generates an image. The display device DD includes a display panel DP, a functional member FM, and the window WM.

The display panel DP is not particularly limited and may be a light emitting display panel, such as an organic light emitting display panel or a quantum dot light emitting display panel.

The display device DD may sense an external input and/or an external pressure in accordance with a configuration of the functional member FM. The functional member FM may include various suitable members to improve functions of the display device DD.

In the present exemplary embodiment, the functional member FM may include an optical film and an input sensor. The functional member FM may further include an adhesive layer to couple the optical film and the input sensor. The optical film decreases a reflectance of an external light. The input sensor senses an external input by a user.

The optical film may include a polarizer and a retarder. The polarizer and the retarder may be a stretching type (e.g., stretching kind) or a coating type (e.g., coating-kind). That is, the polarizer and the retarder may be made through a stretching process or a coating process. The input sensor may sense the external input by an electrostatic capacitive method, a pressure sensing method, or an electromagnetic induction method.

The window WM may form the exterior (e.g., exterior surface) of the electronic device ED. The window WM may include a base substrate and may further include functional layers, such as an anti-reflective layer and/or an anti-fingerprint layer.

In one embodiment, the display device DD may include at least one adhesive layer. The adhesive layer may adhere the window WM to the functional member FM and/or may adhere the functional member FM to the display panel DP. The adhesive layer may be an optically clear adhesive layer and/or a pressure sensitive adhesive layer.

The electronic module EM may include a control module 10, a wireless communication module 20, an image input module 30, a sound input module 40, a sound output module 50, a memory 60, and an external interface module 70. The modules may be mounted on a circuit board or may be electrically connected to each other through a flexible circuit board. The electronic module EM may be electrically connected to the power source module PSM.

The control module 10 controls an overall operation of the electronic device ED. For example, the control module 10 activates or deactivates the display device DD in response to a user's input. The control module 10 controls the image input module 30, the sound input module 40, and the sound output module 50 to meet the user's input. The control module 10 may include at least one microprocessor.

The wireless communication module 20 may transmit/receive a wireless signal to/from other terminals utilizing a Bluetooth or WiFi link. The wireless communication module 20 may transmit/receive a voice signal utilizing a general communication line. The wireless communication module 20 may include a transmitter circuit 22 that modulates a signal to be transmitted and transmits the modulated signal and a receiver circuit 24 that demodulates the signal applied thereto.

The image input module 30 processes an image signal and converts the image signal into image data that may be displayed through the display device DD. The sound input module 40 receives an external sound signal through a microphone in a record mode or a voice recognition mode and converts the external sound signal to electrical voice data. The sound output module 50 converts the sound data provided from the wireless communication module 20 or the sound data stored in the memory 60 and outputs the converted data to the outside.

The external interface module 70 serves as an interface between the control module 10 and external devices, such as an external charger, a wired/wireless data port, a card socket (e.g., a memory card and/or a SIM/UIM card), etc.

The electronic optical module ELM includes the camera module CM. The camera module CM takes an image of an external object. The electronic optical module ELM includes the light emitting device LS and a photosensor PS. The light emitting device LS emits an infrared light, and the photosensor PS receives an infrared light reflected by the external object. These serve as a proximity sensor. The camera module CM, the light emitting device LS, and the photosensor PS are mounted on a circuit board PCB or are electrically connected to each other through a flexible circuit board.

The power source module PSM supplies a power source necessary for the overall operation of the electronic device ED. The power source module PSM includes a battery device (e.g., a normal battery device).

The housing HM is coupled to the display device DD, for example, the window WM to accommodate the above-mentioned other modules. In FIG. 2, the housing HM is shown to include one member. However, the housing HM may include two or more parts assembled (e.g., coupled) to each other.

Figure 4A:
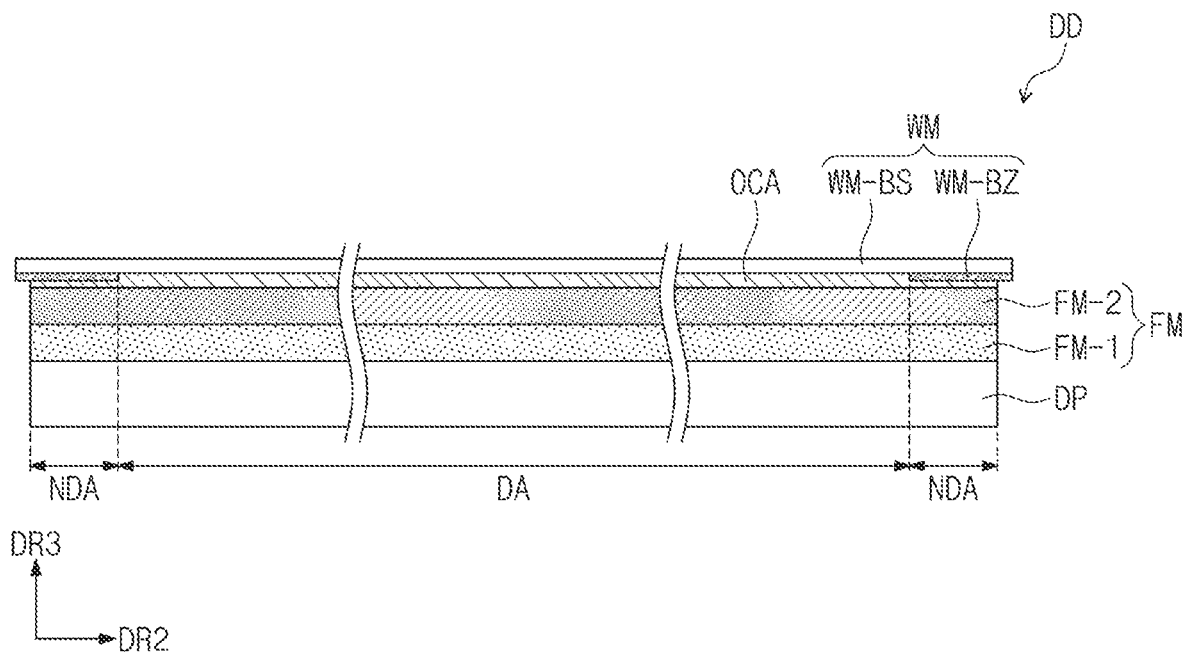
FIGS. 4A and 4B are cross-sectional views showing a display module according to an exemplary embodiment of the present disclosure.
Figure 4B:
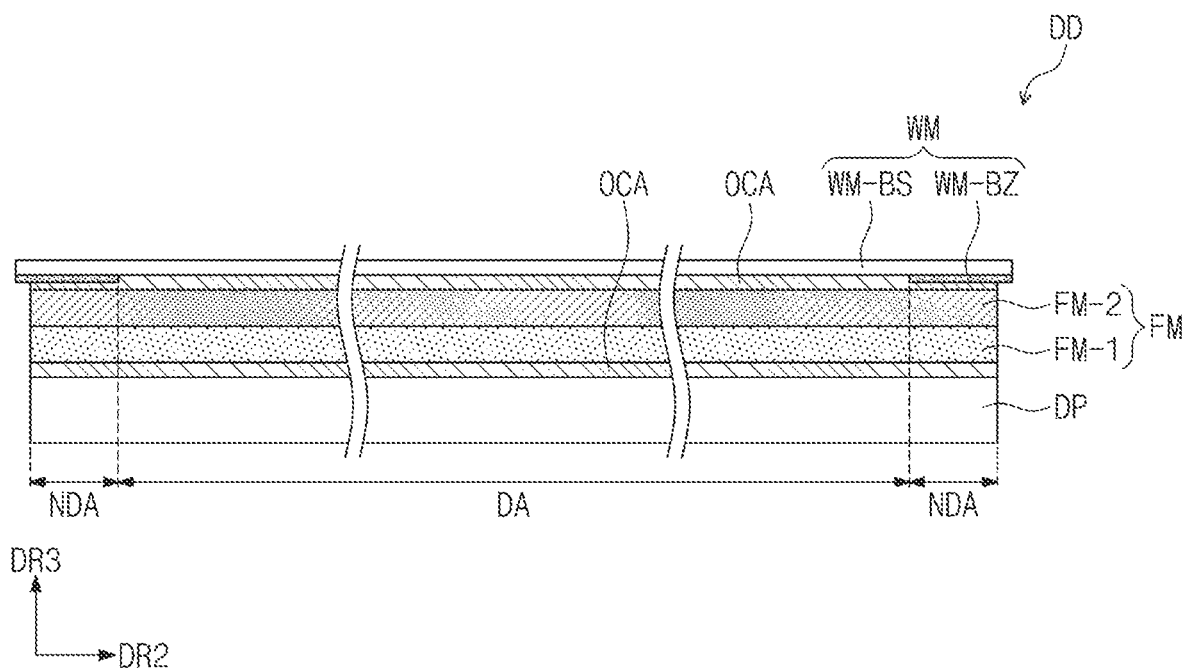
Figure 4C:
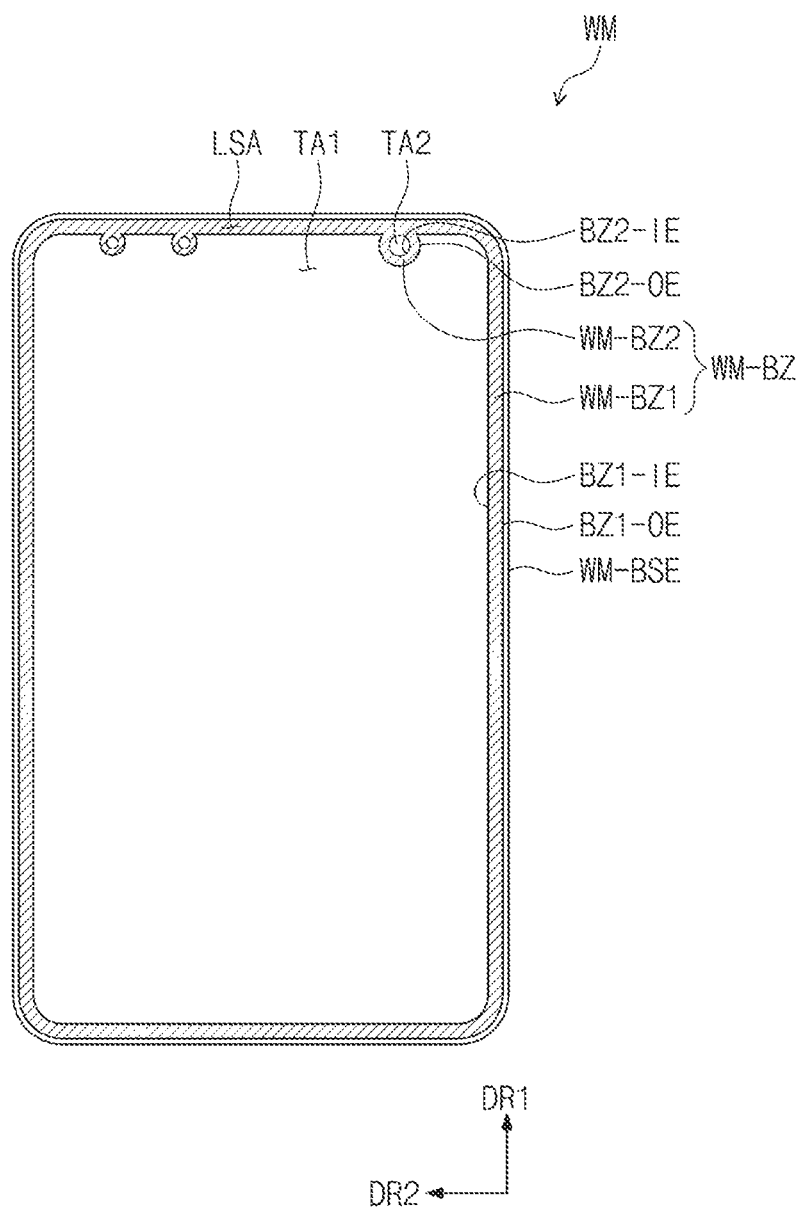
FIG. 4C is a plan view showing a window according to an exemplary embodiment of the present disclosure.

FIGS. 4A and 4B are cross-sectional views showing the display device DD according to an exemplary embodiment of the present disclosure. FIG. 4C is a plan view showing the window WM according to an exemplary embodiment of the present disclosure. Hereinafter, detailed descriptions on the same configurations as those described with reference to FIGS. 1-3 may be omitted (may not be repeated).

Referring to FIGS. 4A and 4B, the display device DD includes the display panel DP, the input sensor FM-1, the optical film FM-2, and the window WM. In the present exemplary embodiment, the display panel DP and the input sensor FM-1 disposed on the display panel DP may be defined as a display module. As shown in FIGS. 4A and 4B, the window WM and the optical film FM-2 may be coupled to each other by the adhesive layer OCA.

Although the optical film FM-2 is not shown in detail, the optical film FM-2 has a multi-layer structure, and the multi-layer structure includes an adhesive layer. The optical film FM-2 is adhered to an upper surface of the input sensor FM-1 by the adhesive layer.

As shown in FIGS. 4A and 4B, the window WM includes a base substrate WM-BS and a bezel pattern WM-BZ. The base substrate WM-BS includes a transparent substrate such as a glass substrate. However, embodiments of the present disclosure should not be limited thereto or thereby. The base substrate WM-BS may include a plastic material. As shown in FIGS. 4A-4B, the base substrate WM-BS has a single-layer structure. However, embodiments of the present disclosure are not limited thereto or thereby. The base substrate WM-BS may include a glass or plastic substrate and a synthetic resin film adhered to the glass or plastic substrate by an adhesive layer.

The bezel pattern WM-BZ may be directly disposed on a lower surface of the base substrate WM-BS. The bezel pattern WM-BZ may have a multi-layer structure including a colored layer and a black light blocking layer. The colored layer and the black light blocking layer may be formed through deposition, printing, and/or coating processes. In an exemplary embodiment of the present disclosure, the bezel pattern WM-BZ may be omitted.

The input sensor FM-1 shown in FIG. 4A may be directly disposed on a base surface provided by the display panel DP. In the present disclosure, the expression that a "B" component is directly disposed on an "A" component refers to that no intervening elements, such as an adhesive layer and/or a pressure sensitive adhesive layer, are present between the "B" component and the "A" component. The "B" component is formed on a base surface provided by the "A" component through successive processes after the "A" component is formed.

As shown in FIG. 4B, the input sensor FM-1 may be coupled to the display panel DP after being separately manufactured. The adhesive layer OCA may be disposed between the input sensor FM-1 and the display panel DP.

As shown in FIG. 4C, a light shielding area LSA in which the bezel pattern WM-BZ is disposed corresponds to the bezel area BZA of FIG. 1, and areas in which the bezel pattern WM-BZ is not disposed correspond to the display area DA and the transmissive area TA of FIG. 1. The display area DA and the transmissive area TA shown in FIG. 1 may be defined as a first transmissive area TA1 and a second transmissive area TA2 of the window WM, which are isolated (or separated) from each other. The first transmissive area TA1 transmits the image generated by the display panel DP, and the second transmissive area TA2 transmits the optical signal, such as the natural light or the infrared light. The first transmissive area TA1 and the second transmissive area TA2 are transmissive areas utilized for different purposes, and the first transmissive area TA1 has a larger area than the second transmissive area TA2. That is, the first transmissive area TA1 of the window WM corresponds to the display area DA and the second transmissive area TA2 of the window WM corresponds to the transmissive area TA of FIG. 1.

The bezel pattern WM-BZ includes a first pattern WM-BZ1 and a second pattern WM-BZ2. The first pattern WM-BZ1 extends along an edge WM-BSE of the base substrate WM-BS. The second pattern WM-BZ2 extends from the first pattern WM-BZ1 to have a convex shape extending toward a center of the base substrate WM-BS when viewed in a plan view (e.g., in a direction parallel to a planar surface of the base substrate WM-BS). In an exemplary embodiment of the present disclosure, the second pattern WM-BZ2 may be omitted.

In FIG. 4C, the edge WM-BSE of the base substrate WM-BS and an outer edge BZ1-OE of the first pattern WM-BZ1 are shown to be distinct from each other. However, the edge WM-BSE of the base substrate WM-BS and the outer edge BZ1-OE of the first pattern WM-BZ1 may be aligned (e.g., overlap) with each other when viewed in a plan view (e.g., in a direction normal to the base substrate WM-BS).

In the present exemplary embodiment, the first transmissive area TA1 is defined by an inner edge BZ1-IE of the first pattern WM-BZ1 and an outer edge BZ2-OE of the second pattern WM-BZ2. The second transmissive area TA2 is defined by an inner edge BZ2-IE of the second pattern WM-BZ2.

Figure 5A:
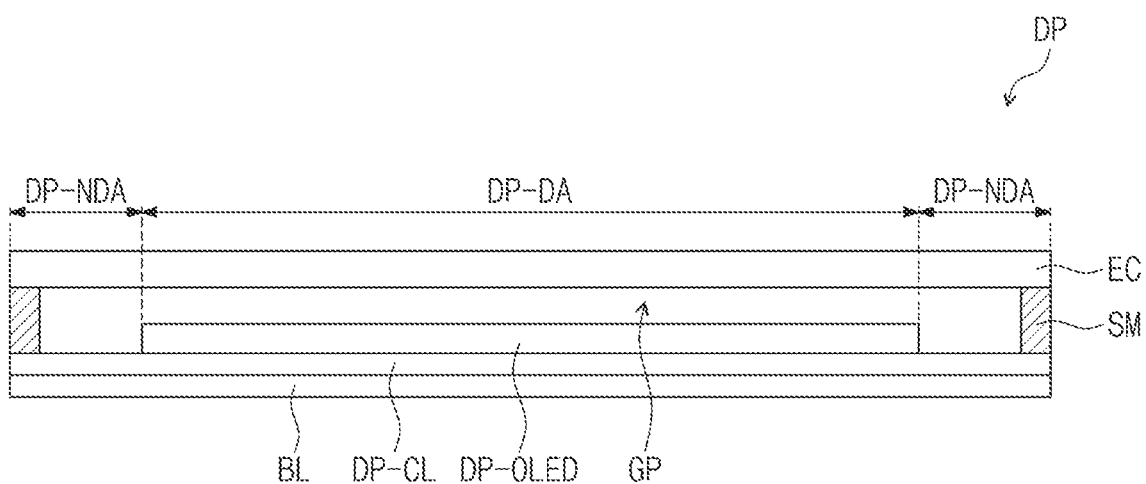
FIG. 5A is a cross-sectional view showing a display panel according to an exemplary embodiment of the present disclosure.
Figure 5B:
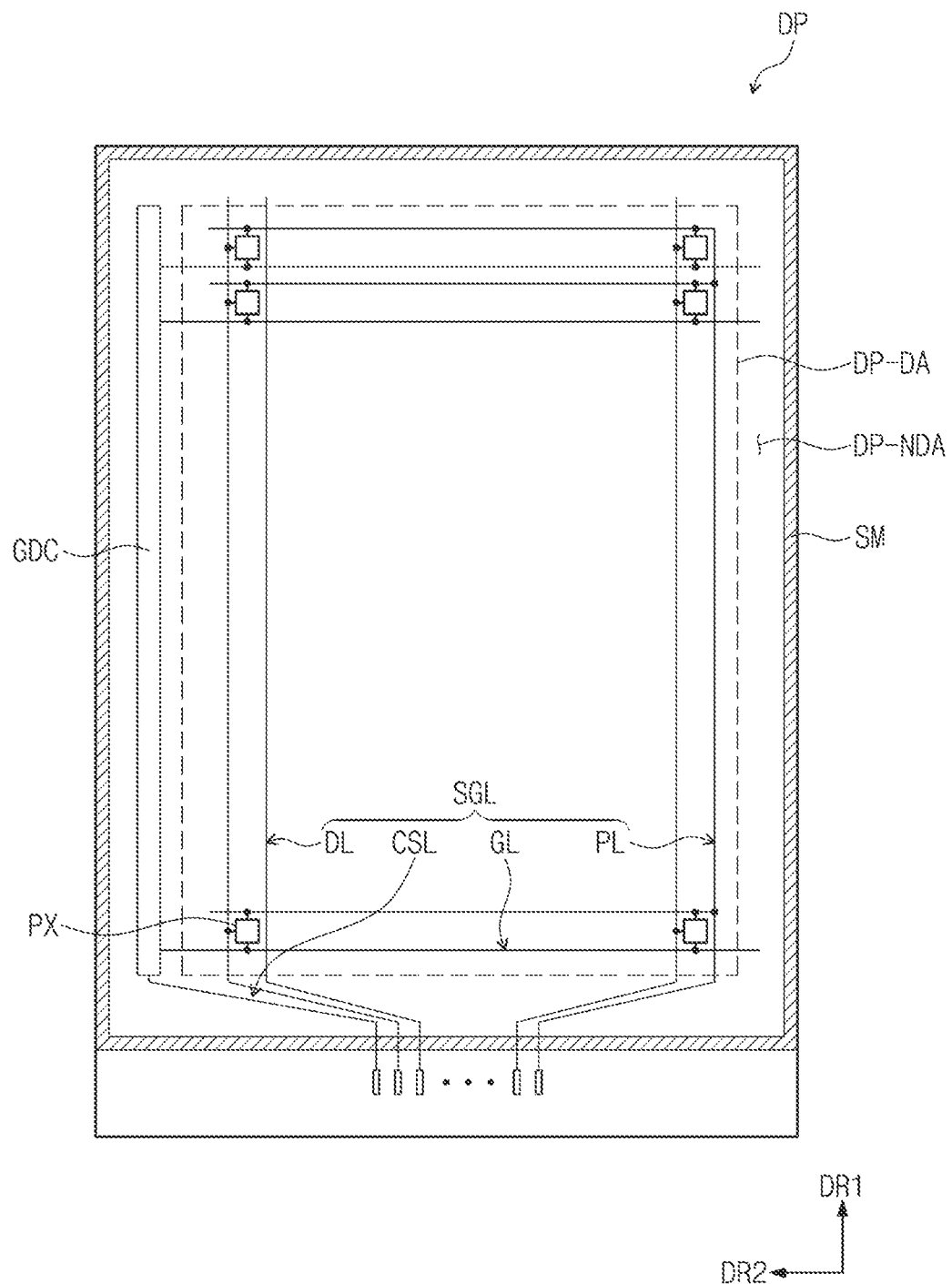
FIG. 5B is a plan view showing a display panel according to an exemplary embodiment of the present disclosure.
Figure 5C:
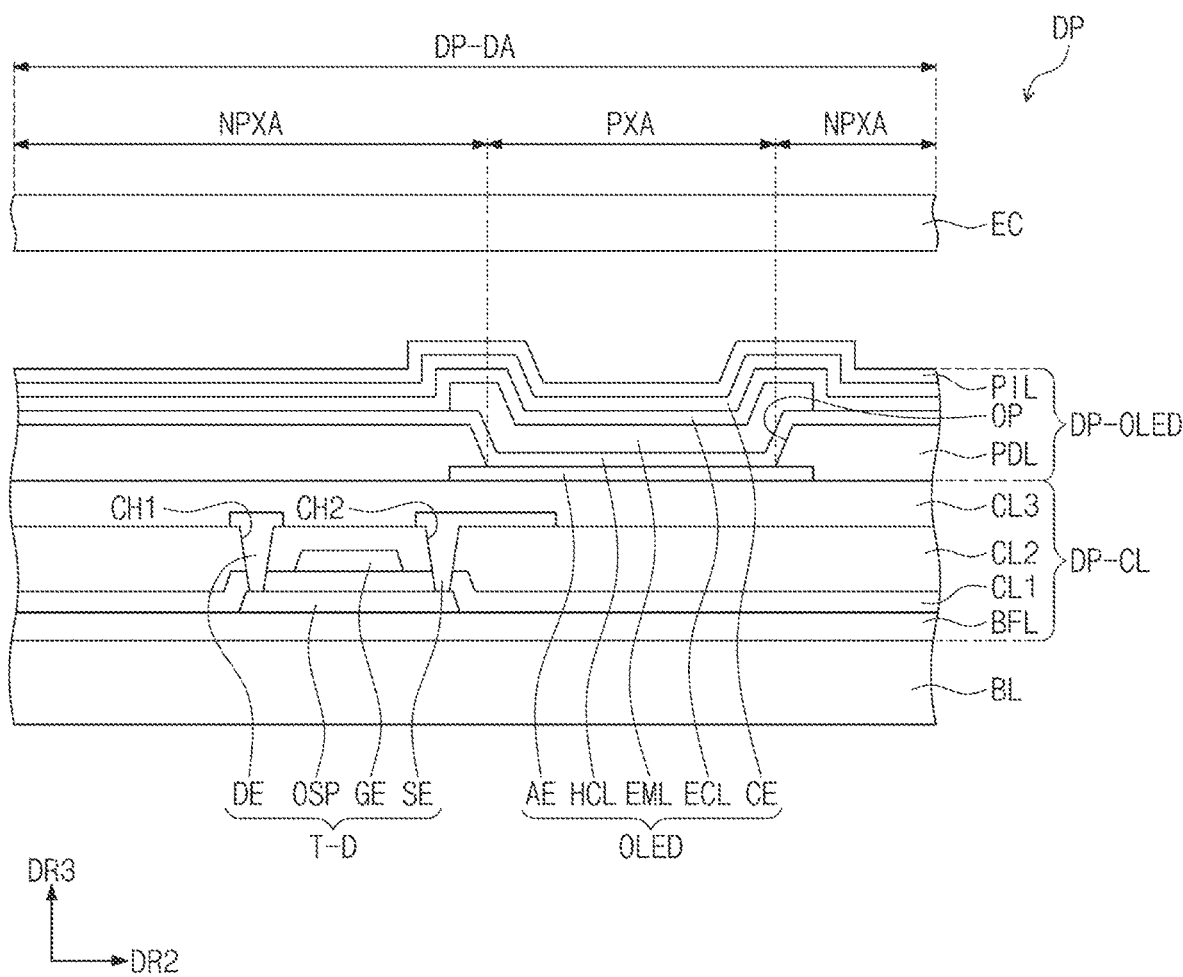
FIG. 5C is an enlarged cross-sectional view showing a display panel according to an exemplary embodiment of the present disclosure.
Figure 5D:
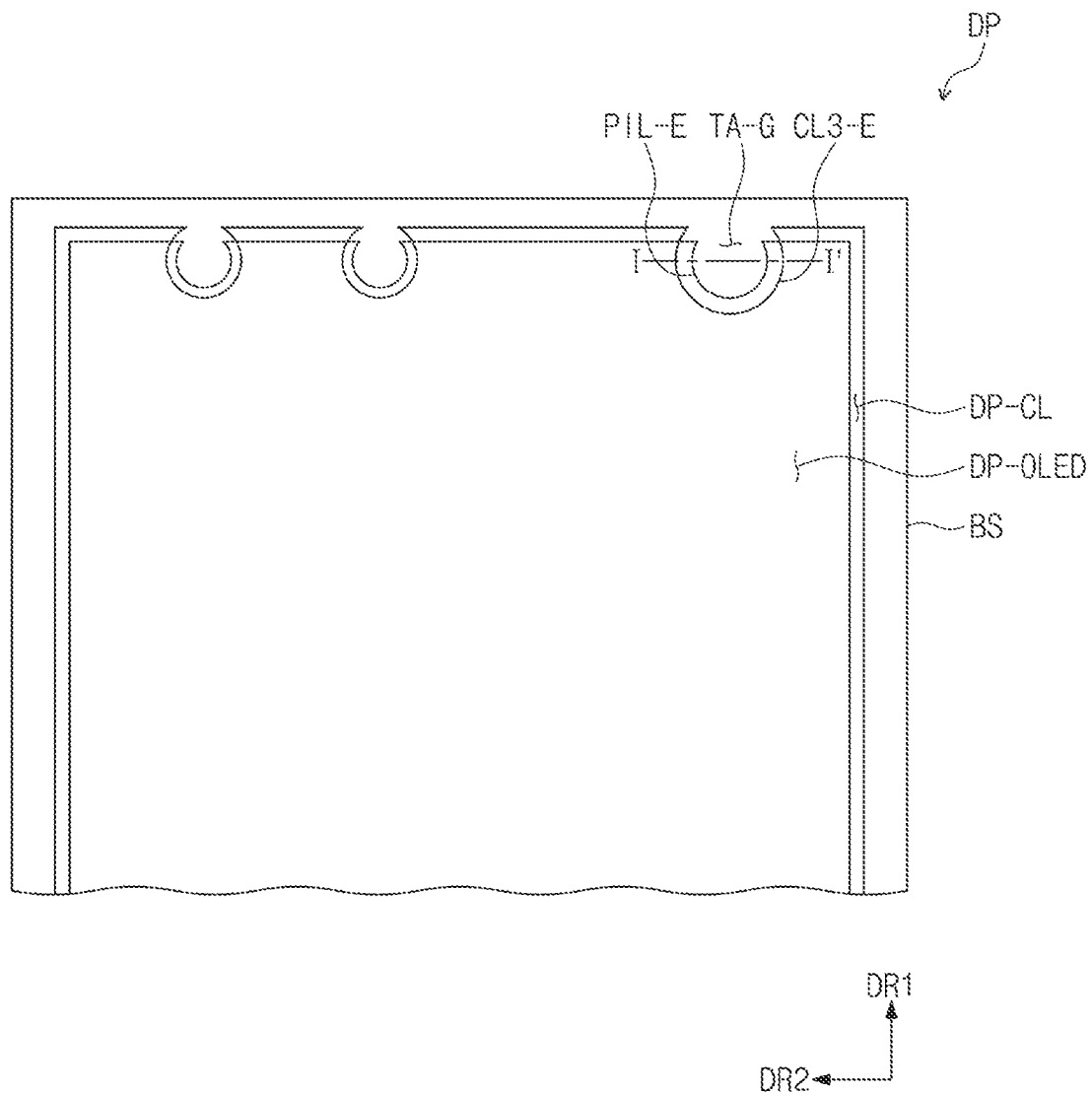
FIG. 5D is a plan view showing a display panel according to an exemplary embodiment of the present disclosure.
Figure 5E:
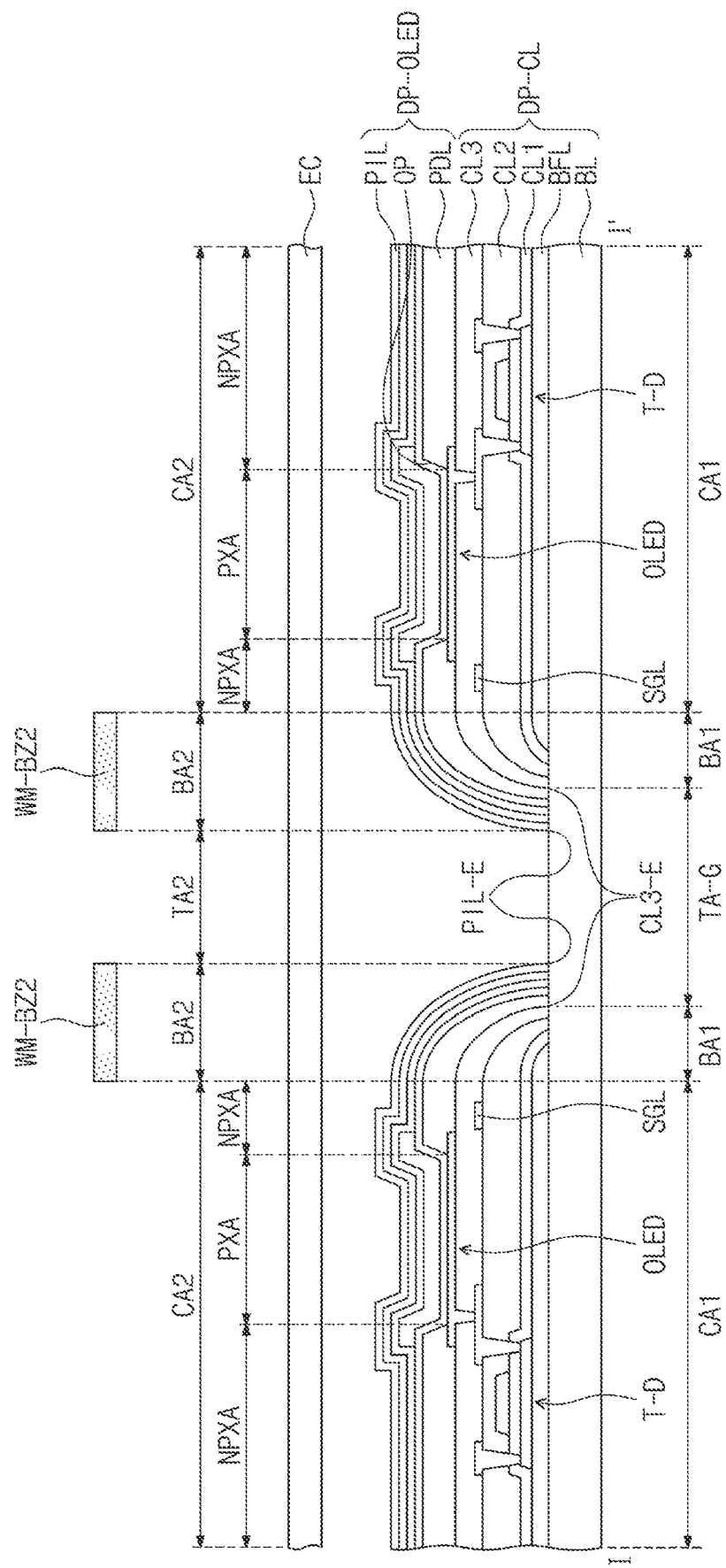
FIG. 5E is a cross-sectional view taken along the line I-I' of FIG. 5D.
Figure 5F:
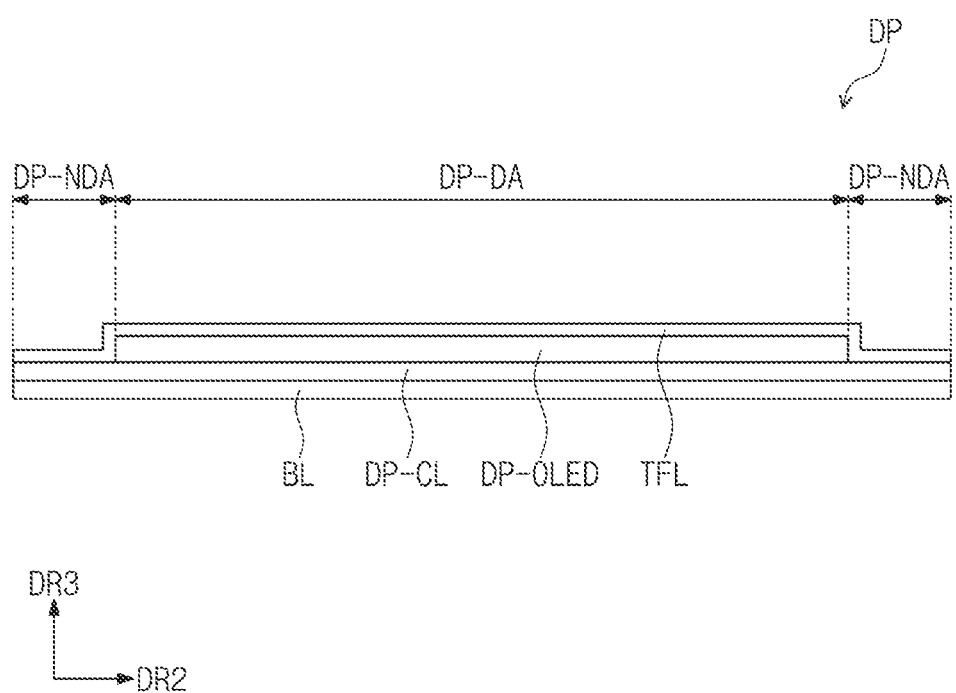
FIG. 5F is a cross-sectional view showing a display panel according to an exemplary embodiment of the present disclosure.

FIG. 5A is a cross-sectional view showing the display panel DP according to an exemplary embodiment of the present disclosure. FIG. 5B is a plan view showing the display panel DP according to an exemplary embodiment of the present disclosure. FIG. 5C is an enlarged cross-sectional view showing the display panel DP according to an exemplary embodiment of the present disclosure. FIG. 5D is a plan view showing the display panel DP according to an exemplary embodiment of the present disclosure. FIG. 5E is a cross-sectional view taken along the line I-I' of FIG. 5D to show the display panel DP. FIG. 5F is a cross-sectional view showing the display panel DP according to an exemplary embodiment of the present disclosure.

Referring to FIG. 5A, the display panel DP includes a base layer BL, a circuit element layer DP-CL disposed on the base layer BL, a display element layer DP-OLED disposed on the circuit element layer DP-CL, an encapsulation substrate EC, and a sealing member SM.

The base layer BL may include a glass substrate. In addition, the base layer BL may include a substrate having a substantially uniform refractive index in a visible light wavelength range.

The circuit element layer DP-CL includes at least one insulating layer and a circuit element. The circuit element layer DP-CL includes at least a transistor. The insulating layer of the circuit element layer DP-CL may include at least one inorganic layer and/or at least one organic layer. The circuit element includes a signal line, a driving circuit of a pixel, and/or the like.

The display element layer DP-OLED includes at least a light emitting device. The display element layer DP-OLED may include organic light emitting diodes as the light emitting device. The display element layer DP-OLED may include a pixel definition layer including, for example, an organic material.

The encapsulation substrate EC may be a transparent substrate. The encapsulation substrate EC may include a glass substrate. In addition, the encapsulation substrate EC may include a substrate having a substantially uniform refractive index in a visible light wavelength range.

A stack structure of the base layer BL to the display element layer DP-OLED may be defined as a lower display substrate. The sealing member SM couples the lower display substrate and the encapsulation substrate EC. The sealing member SM extends along an edge of the encapsulation substrate EC.

The sealing member SM overlaps with a non-display area DP-NDA of the display panel DP. The non-display area DP-NDA of the display panel DP is an area in which a pixel PX (to be described later) is not formed. The non-display area DP-NDA of the display panel DP overlaps with the non-display area NDA of the electronic device ED shown in FIG. 1. The non-display area DP-NDA has a width of about 0.5 mm to about 2 mm. The width is measured in each of the left and right sides of a display area DP-DA along the second direction DR2. The sealing member SM has a width of about 200 μm to about 700 μm, which is smaller than the width of the non-display area DP-NDA.

The sealing member SM may define a gap GP between the lower display substrate and the encapsulation substrate EC. The gap GP may be filled with air or inert gases (hereinafter, referred to as an "external gas"). The encapsulation substrate EC and the sealing member SM may prevent or substantially prevent moisture from infiltrating into the lower display substrate. In an exemplary embodiment of the present disclosure, the sealing member SM may directly couple an upper surface of the base layer BL and a lower surface of the sealing substrate EC.

The sealing member SM may include an inorganic adhesive layer such as a frit. However, embodiments of the present disclosure are not limited thereto or thereby. According to another embodiment, the sealing member SM may include an organic adhesive layer. In the present exemplary embodiment, because the display panel DP may be completely sealed from the outside, the display panel DP may have improved strength and may prevent or substantially prevent defects of the light emitting device from occurring.

Referring to FIG. 5B, the display panel DP includes a driving circuit GDC, a plurality of signal lines SGL (hereinafter, referred to as "signal lines"), and a plurality of pixels PX (hereinafter, referred to as "pixels"). The pixels PX are disposed in the display area DP-DA. Each of the pixels PX includes the light emitting device and a pixel driving circuit connected to the light emitting device. The driving circuit GDC, the signal lines SGL, and the pixel driving circuit may be included in the circuit element layer DP-CL shown in FIG. 5A.

The driving circuit GDC includes a scan driving circuit. The scan driving circuit generates a plurality of scan signals (hereinafter, referred to as "scan signals") and sequentially outputs the scan signals to a plurality of scan lines GL (hereinafter, referred to as "scan lines"). The scan driving circuit may further output other control signals to the driving circuit of the pixels PX.

The scan driving circuit may include a plurality of thin film transistors formed through the same processes as the driving circuit of the pixels PX, e.g., a low temperature polycrystalline silicon (LTPS) process or a low temperature polycrystalline oxide (LTPO) process.

The signal lines SGL include the scan lines GL, data lines DL, a power source line PL, and a control signal line CSL. Each of the scan lines GL is connected to a corresponding pixel from among the pixels PX, and each of the data lines DL is connected to a corresponding pixel from among the pixels PX. The power source line PL is connected to the pixels PX. The control signal line CSL provides the scan driving circuit with control signals.

The signal lines SGL may be connected to a circuit substrate. The signal lines SGL may be connected to a timing control circuit in the form of an integrated chip mounted on the circuit substrate. In an exemplary embodiment, the integrated chip may be disposed in the non-display area DP-NDA and may be connected to the signal lines SGL.

Referring to FIG. 5C, the circuit element layer DP-CL includes a plurality of insulating layers. The circuit element layer DP-CL includes a buffer layer BFL, a first inorganic layer CL1, a second inorganic layer CL2, and an organic layer CL3. FIG. 5C shows an arrangement relationship between a semiconductor pattern OSP, a control electrode GE, an input electrode DE, and an output electrode SE, which form a driving transistor T-D, as a representative example. First and second through holes CH1 and CH2 are also shown by way of example.

The display element layer DP-OLED includes the light emitting device. The display element layer DP-OLED may include the organic light emitting diodes OLED as the light emitting device. The display element layer DP-OLED includes the pixel definition layer. As an example, the pixel definition layer may include an organic material.

A first electrode AE is disposed on the organic layer CL3. The first electrode AE is electrically connected to the output electrode SE via other transistor or connector like an electrode or signal lines. The pixel definition layer PDL is provided with an opening OP defined therethrough. At least a portion of the first electrode AE is exposed through the opening OP of the pixel definition layer PDL. The opening OP of the pixel definition layer PDL will be referred to as a light emitting opening to be distinct from other openings.

The display area DP-DA of the display panel DP includes a light emitting area PXA and a non-light emitting area NPXA disposed adjacent to the light emitting area PXA. The non-light emitting area NPXA surrounds the light emitting area PXA. In the present exemplary embodiment, the light emitting area PXA is defined to correspond to a portion of the first electrode AE exposed through the light emitting opening OP.

A hole control layer HCL may be commonly disposed on the light emitting area PXA and the non-light emitting area NPXA. The hole control layer HCL may include a hole transport layer and may further include a hole injection layer. A light emitting layer EML may be disposed on the hole control layer HCL. The light emitting layer EML may be disposed in an area corresponding to the light emitting opening OP. That is, the light emitting layer EML may be formed in each of the pixels after being divided into plural portions. The light emitting layer EML may include an organic material and/or an inorganic material. The light emitting layer EML may generate light (e.g., a predetermined color light).

An electron control layer ECL may be disposed on the light emitting layer EML. The electron control layer ECL may include an electron transport layer and may further include an electron injection layer. The hole control layer HCL and the electron control layer ECL may be commonly formed in plural pixels utilizing an open mask. A second electrode CE may be disposed on the electron control layer ECL. The second electrode CE may be commonly disposed in the plural pixels.

A protective layer PIL may be disposed on the second electrode CE. The protective layer PIL may include an inorganic material, e.g., silicon oxide, silicon nitride, and/or silicon oxynitride.

Referring to FIGS. 5D and 5E, the circuit element layer DP-CL exposes a portion TA-G (hereinafter, referred to as a "non-deposition area") of the base layer BL corresponding to the second transmissive area TA2. The display element layer DP-OLED may also expose the non-deposition area TA-G of the base layer BL corresponding to the second transmissive area TA2.

The circuit element layer DP-CL includes a circuit area CA1 that does not overlap with the bezel pattern WM-BZ (refer to FIG. 4C) and a boundary area BA1 that overlaps with the second pattern WM-BZ2. When viewed in a plan view (e.g., in a direction normal to the base substrate WM-BS), an edge CL3-E of the organic layer CL3, which directly covers the transistor T-D, overlaps with the second pattern WM-BZ2.

As shown in FIG. 5D, the edge CL3-E of the organic layer CL3 defines a concave area that is concave toward a center of the organic layer CL3 in a plan view (e.g., in a direction parallel to a planar surface of the base substrate WM-BS). The concave area surrounds the non-deposition area TA-G.

The edge CL3-E of the organic layer CL3 defines an open area of the circuit element layer DP-CL corresponding to the non-deposition area TA-G. The transistor may not be disposed in the open area of the circuit element layer DP-CL.

As shown in FIG. 5E, the signal line SGL may be disposed adjacent to the boundary area BA1. The signal line SGL may include the scan line GL (refer to FIG. 5B) or the data lines DL (refer to FIG. 5B). In one embodiment, the signal line SGL may be disposed in the boundary area BA1.

The boundary area BA1 has a thickness smaller than that of the circuit area CA1. The difference in thickness between the boundary area BA1 and the circuit area CA1 occurs due to a shadow phenomenon caused by a mask in a deposition process of the circuit element layer DP-CL.

The display element layer DP-OLED includes an element area CA2 that does not overlap with the bezel pattern WM-BZ (refer to FIG. 4C) and a boundary area BA2 that overlaps with the second pattern WM-BZ2. An outer edge PIL-E of the protective layer PIL overlaps with the second pattern WM-BZ2 when viewed in a plan view (e.g., in a direction normal to the base substrate WM-BS).

As shown in FIG. 5D, the outer edge PIL-E of the protective layer PIL includes a concave area that is concave toward a center of the protective layer PIL in a plan view (e.g., in a direction parallel to a planar surface of the base substrate WM-BS). The concave area surrounds the non-deposition area TA-G. The outer edge PIL-E of the protective layer PIL defines an open area of the display element layer DP-OLED corresponding to the non-deposition area TA-G. The light emitting device may not be disposed in the open area of the display element layer DP-OLED.

As shown in FIG. 5E, the boundary area BA2 has a thickness smaller than that of the element area CA2. The boundary area BA2 of the display element layer DP-OLED covers the boundary area BA1 of the circuit element layer DP-CL.

In the boundary areas BA1 and BA2, upper insulating layers formed by a subsequent process seal lower insulating layers. For instance, the second inorganic layer CL2 seals the first inorganic layer CL1. The protective layer PIL seals all the lower insulating layers around the non-deposition area TA-G.

In one embodiment, at least some insulating layers among the insulating layers of the circuit element layer DP-CL and the display element layer DP-OLED may overlap with the second transmissive area TA2. A metal pattern (such as a signal line) does not overlap with the second transmissive area TA2.

In one embodiment, only one of the circuit element layer DP-CL and the display element layer DP-OLED may form a non-deposition area corresponding to the non-deposition area TA-G. From among the layers of the other one of the circuit element layer DP-CL and the display element layer DP-OLED, only a layer or pattern having a high reflectance is not (e.g., may not be) deposited, and a layer having a relatively high transmittance is (e.g., may be) disposed to overlap with the non-deposition area TA-G.

When the non-deposition area is formed in only one of the circuit element layer DP-CL and the display element layer DP-OLED, an area of the display panel DP corresponding to the second transmissive area TA2 has a higher transmittance than other areas. When the layer or pattern having the high reflectance is not deposited in at least one of the circuit element layer DP-CL and the display element layer DP-OLED, an area of the display panel DP corresponding to the second transmissive area TA2 has a higher transmittance than other areas. That is, the high transmittance area is formed in the display panel DP.

The high transmittance area (described above) may be more suitable for the light emitting device LS and the photosensor PS than the camera module CM. The light emitting device LS and the photosensor PS may still perform a desired function even though areas of the light emitting device LS and the photosensor PS, which correspond to the second transmissive area TA2, have a low transmittance as compared with the camera module CM.

The encapsulation substrate EC and the sealing member SM are omitted from (e.g., not included in) the display panel DP shown in FIG. 5F compared with the display panel DP shown in FIGS. 5A-5E. An upper insulating layer TFL is disposed instead of the encapsulation substrate EC and the sealing member SM.

The upper insulating layer TFL may include a plurality of thin layers. The upper insulating layer TFL may include a thin layer encapsulation stack structure. The thin layer encapsulation stack structure includes a first inorganic layer, an organic layer, and a second inorganic layer. The first inorganic layer and the second inorganic layer protect the display element layer DP-OLED from moisture and oxygen, and the organic layer protects the display element layer DP-OLED from foreign substance such as dust particles. The first inorganic layer and the second inorganic layer are each one of (e.g., each selected from) a silicon nitride layer, a silicon oxynitride layer, and a silicon oxide layer. In an exemplary embodiment, the first inorganic layer and the second inorganic layer include a titanium oxide layer or an aluminum oxide layer. The organic layer may include an acrylic-based organic layer. However, embodiments of the present disclosure are not limited thereto or thereby.

Figure 6A:
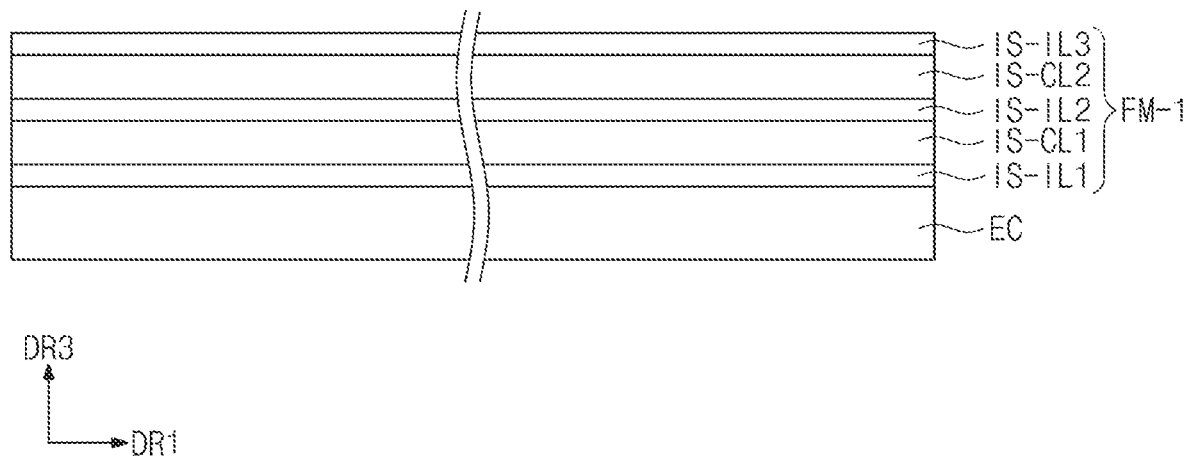
FIG. 6A is a cross-sectional view showing an input sensor according to an exemplary embodiment of the present disclosure.
Figure 6B:
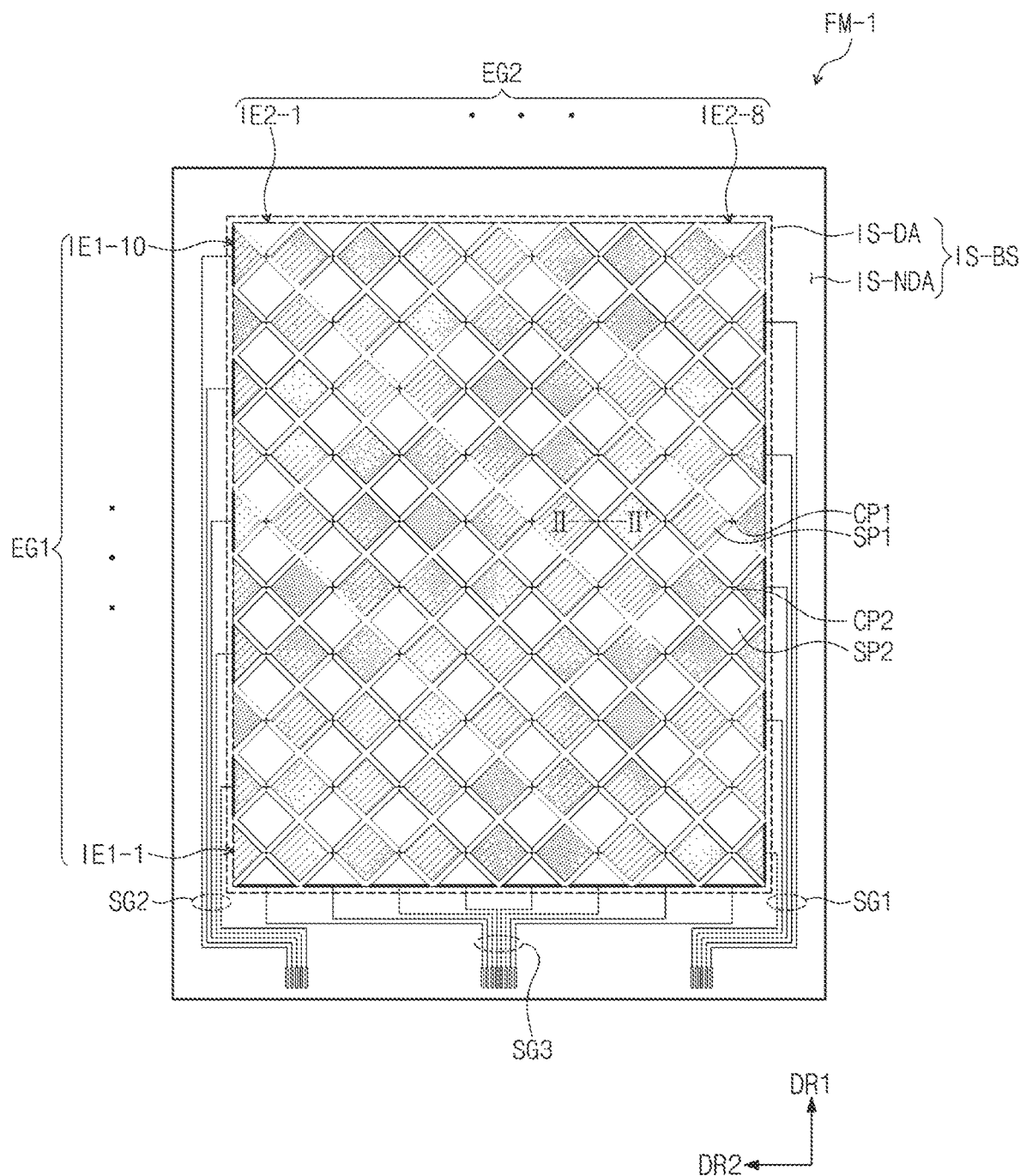
FIG. 6B is a plan view showing an input sensor according to an exemplary embodiment of the present disclosure.
Figure 6C:
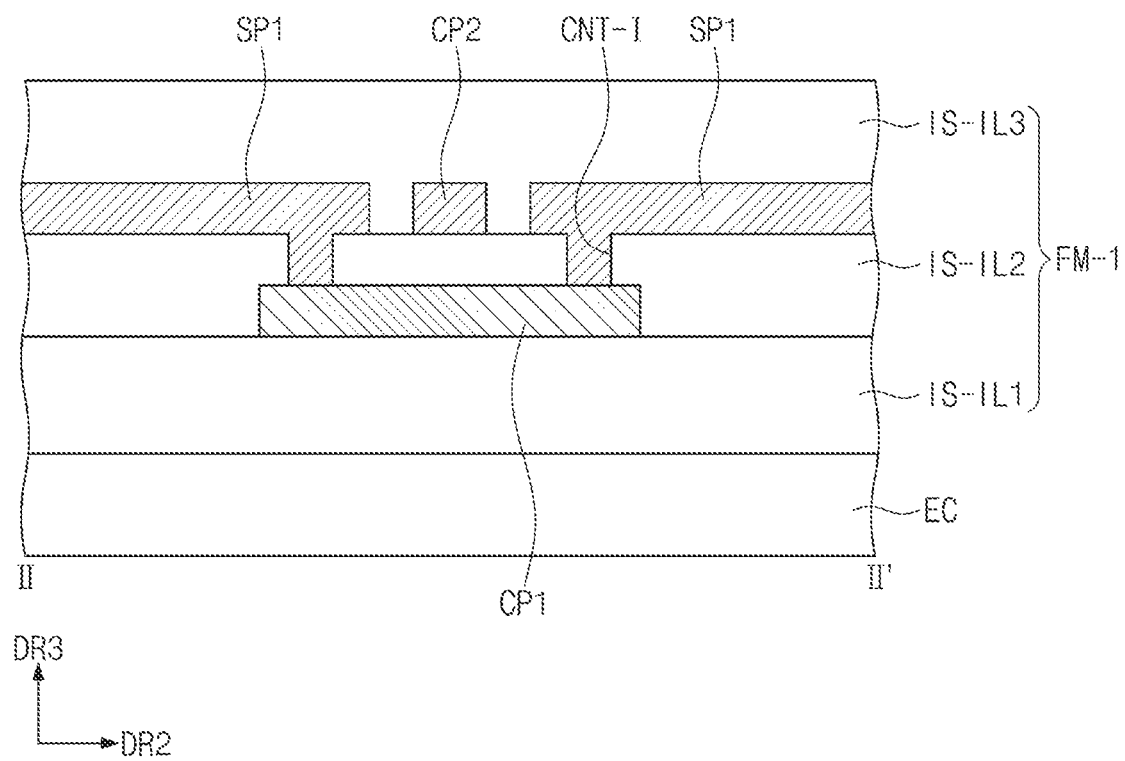
FIG. 6C is a cross-sectional view taken along the line II-II' of FIG. 6B.

FIG. 6A is a cross-sectional view showing the input sensor FM-1 according to an exemplary embodiment of the present disclosure. FIG. 6B is a plan view showing the input sensor FM-1 according to an exemplary embodiment of the present disclosure. FIG. 6C is a cross-sectional view taken along the line II-II' of FIG. 6B to show the input sensor FM-1. In FIGS. 6A and 6C, the encapsulation substrate EC providing the base surface is schematically shown.

Referring to FIG. 6A, the input sensor FM-1 may include a first insulating layer IS-IL1, a first conductive layer IS-CL1, a second insulating layer IS-IL2, a second conductive layer IS-CL2, and a third insulating layer IS-IL3. The first insulating layer IS-IL1 may be directly disposed on the encapsulation substrate EC. In an exemplary embodiment of the present disclosure, the first insulating layer IS-IL1 may be omitted (e.g., may not be included).

Each of the first conductive layer IS-CL1 and the second conductive layer IS-CL2 may have a single-layer structure or a multi-layer structure of layers stacked in the third directional axis DR3. The conductive layer having the multi-layer structure may include at least two layers selected from among transparent conductive layers and metal layers. The conductive layer having the multi-layer structure may include metal layers including metals that are different from each other. The transparent conductive layer may include indium tin oxide (ITO), indium zinc oxide (IZO), zinc oxide (ZnO), indium tin zinc oxide (ITZO), poly(3,4-ethylenedioxythiophene) (PEDOT), a metal nanowire, or a graphene. The metal layer may include molybdenum, silver, titanium, copper, aluminum, or alloys thereof. For instance, each of the first conductive layer IS-CL1 and the second conductive layer IS-CL2 may have a three-layer structure of titanium/aluminum/titanium.

Each of the first conductive layer IS-CL1 and the second conductive layer IS-CL2 includes a plurality of conductive patterns. Hereinafter, the first conductive layer IS-CL1 will be described as including first conductive patterns, and the second conductive layer IS-CL2 will be described as including second conductive patterns. Each of the first conductive patterns and the second conductive patterns include sensing electrodes and signal lines connected to the sensing electrodes. The sensing electrodes may be an opaque electrode having a mesh shape, which does not overlap with the non-light emitting area NPXA and does overlap with the light emitting area PXA shown in FIG. 5E. In one embodiment, the sensing electrodes may be a transparent electrode that overlaps with the light emitting area PXA and the non-light emitting area NPXA.

Each of the first to third insulating layers IS-IL1 to IS-IL3 may include an inorganic material or an organic material. In the present exemplary embodiment, the first insulating layer IS-IL1 and the second insulating layer IS-IL2 may be an inorganic layer containing the inorganic material. The inorganic material may include at least one of aluminum oxide, titanium oxide, silicon oxide, silicon oxynitride, zirconium oxide, and hafnium oxide. The third insulating layer IS-IL3 may include an organic layer. The organic layer may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin.

The input sensor FM-1 includes a first electrode group EG1, a second electrode group EG2, a first signal line group SG1 connected to a portion of the first electrode group EG1, a second signal line group SG2 connected to the other portion of the first electrode group EG1, and a third signal line group SG3 connected to the second electrode group EG2.

The first electrode group EG1 and the second electrode group EG2 cross each other. FIG. 6B shows the first electrode group EG1 including ten first sensing electrodes IE1-1 to IE1-10 and the second electrode group EG2 including eight second sensing electrodes IE2-1 to IE2-8 as a representative example. The external input may be sensed by a mutual-capacitance method and/or a self-capacitance method. Coordinates of the external input may be calculated by the mutual-capacitance method during a first period, and then the coordinates of the external input may be re-calculated by the self-capacitance method during a second period From among the electrodes of the first electrode group EG1, odd-numbered electrodes are connected to the first signal line group SG1, and even-numbered electrodes are connected to the second signal line group SG2. Each of the electrodes of the first electrode group EG1 includes a plurality of first sensor portions SP1 and a plurality of first connection portions CP1. Each of the electrodes of the second electrode group EG2 includes a plurality of second sensor portions SP2 and a plurality of second connection portions CP2. Shapes of the electrodes of the first electrode group EG1 and the second electrode group EG2 are not particularly limited.

As shown in FIGS. 6A and 6C, the first connection portions CP1 may be formed from the first conductive layer IS-CL1. The first sensor portions SP1 and the second connection portions CP2 may be formed from the second conductive layer IS-CL2. The second sensor portions SP2 may be formed from the second conductive layer IS-CL2 as well. The first connection portion CP1 may be electrically connected to the first sensor portions SP1 via connection contact holes CNT-1 defined through the second insulating layer IS-IL2.

The conductive patterns disposed on the same layer may be formed through the same process, may include the same material, and may have the same stack structure. The stack order of the components of the input sensor FM-1 may be suitably changed. In an exemplary embodiment of the present disclosure, the first sensor portions SP1 and the second connection portion CP2 may be directly disposed on the first insulating layer IS-IL1. The second insulating layer IS-IL2 may be disposed on the first insulating layer IS-IL1 to cover the first sensor portions SP1 and the second connection portion CP2. The first connection portion CP1 disposed on the second insulating layer IS-IL2 may be electrically connected to the first sensor portions SP1 via the connection contact holes CNT-1 defined through the second insulating layer IS-IL2. In the present exemplary embodiment, the input sensor FM-1 having a two-layer structure has been described as a representative example. However, the input sensor FM-1 may have a single-layer structure driven by the self-capacitance method.

Figure 7A:
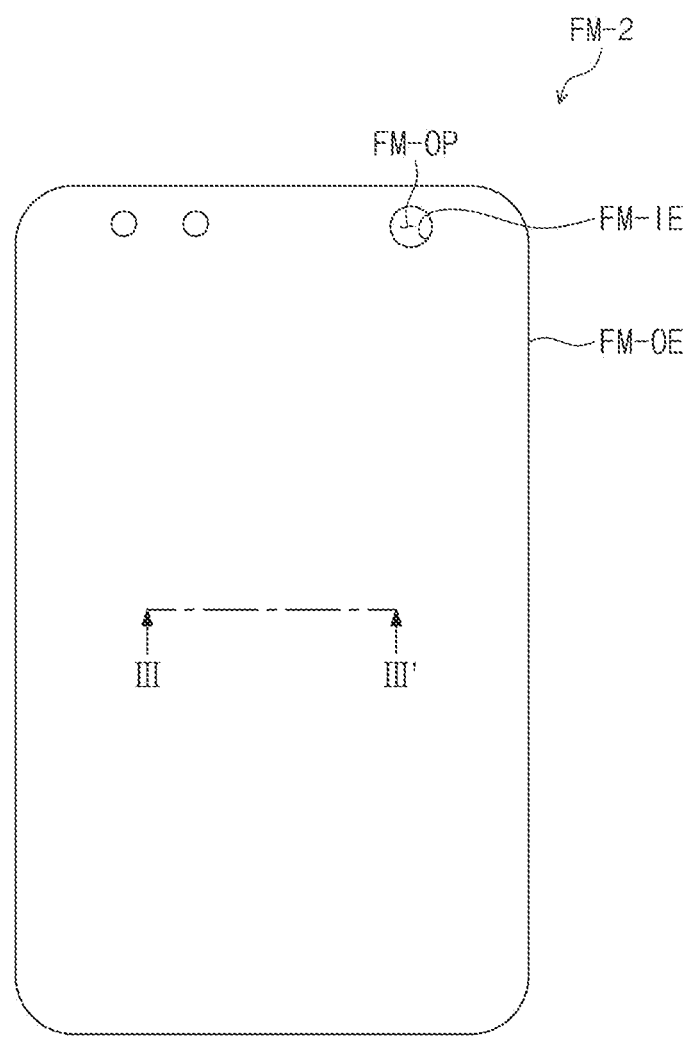
FIGS. 7A and 7B are plan views showing an optical film according to an exemplary embodiment of the present disclosure.
Figure 7B:
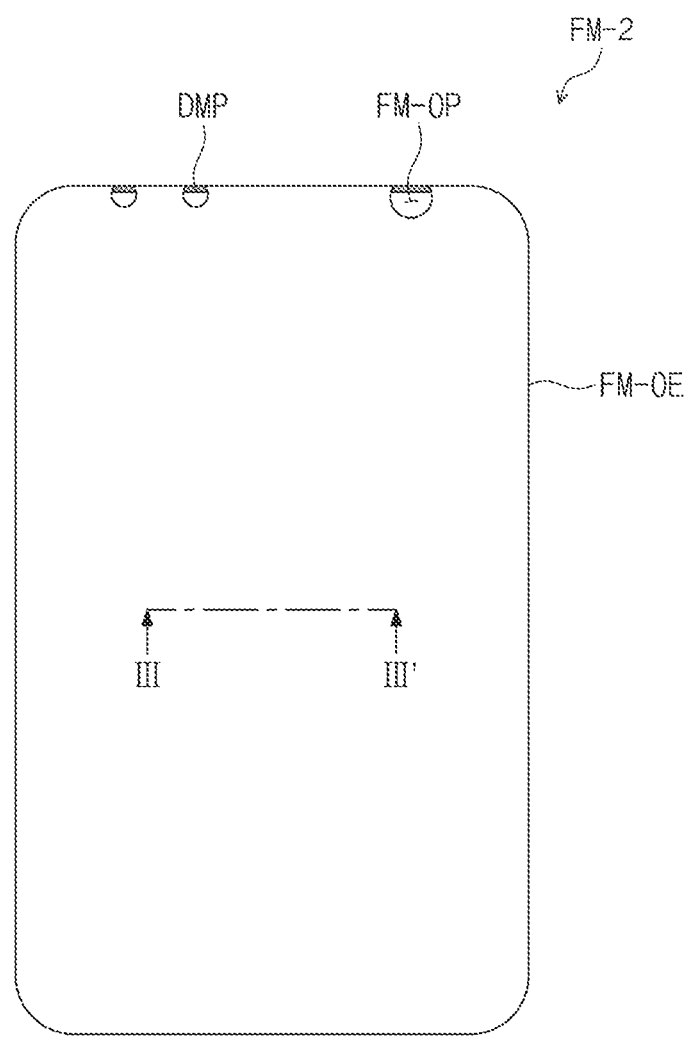
Figure 7C:
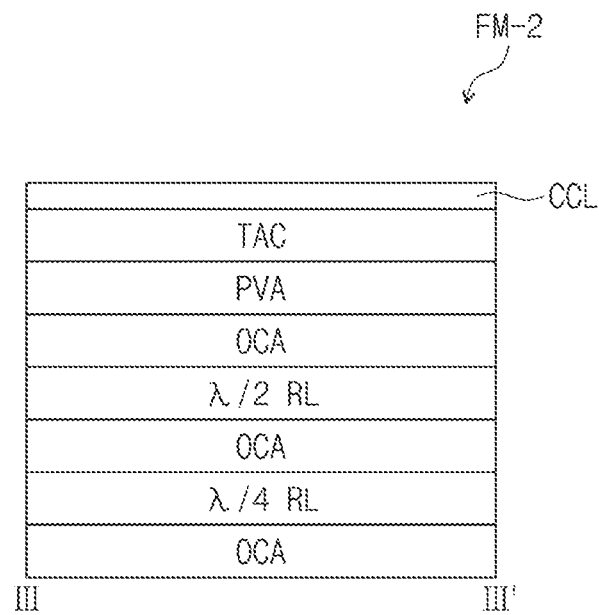
FIGS. 7C and 7D are cross-sectional views taken along the line III-III' of FIGS. 7A and 7B.
Figure 7D:
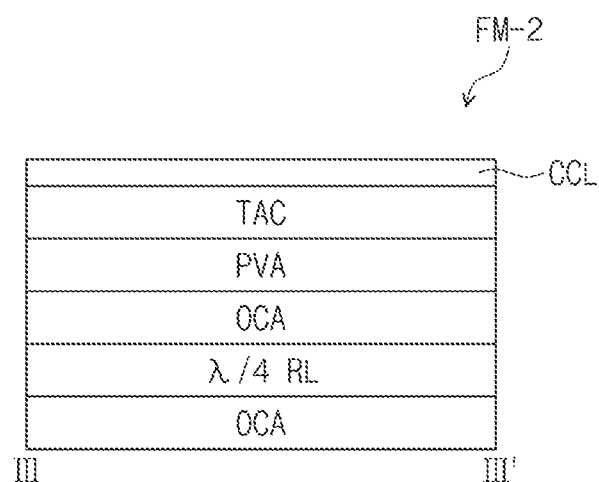

FIGS. 7A and 7B are plan views showing the optical film FM-2 according to an exemplary embodiment of the present disclosure. FIGS. 7C and 7D are cross-sectional views taken along the line III-III' of FIGS. 7A and 7B to show the optical film FM-2.

Referring to FIG. 7A, an open area FM-OP corresponding to the second transmissive area TA2 (refer to FIG. 4C) is defined in the optical film FM-2. The open area FM-OP overlaps with the second transmissive area TA2. The open area FM-OP corresponds to an area in which the optical film FM-OP is not disposed because the optical film FM-OP is removed therefrom. The open area FM-OP may be an opening formed from a lower surface of the optical film FM-2 to an upper surface of the optical film FM-2.

An inner edge FM-IE of the optical film FM-2 is disposed corresponding to the non-deposition area TA-G (refer to FIG. 5D). The open area FM-OP overlaps with the non-deposition area TA-G. In the present exemplary embodiment, the inner edge FM-IE of the optical film FM-2 may define a circle on a plan view.

In the present exemplary embodiment, the inner edge FM-IE of the optical film FM-2 is distinct from an outer edge FM-OE of the optical film FM-2, and the open area FM-OP has a shape corresponding to a shape of the second transmissive area TA2. However, embodiments of the present disclosure are not limited thereto or thereby. That is, the shape of the open area FM-OP may be suitably changed. When the inner edge FM-IE of the optical film FM-2 defines a circular shape, an inner edge BZ2-IE of the second pattern WM-BZ2 shown in FIG. 4C also defines a circular shape. The above-mentioned two circles may have the same area, or one of the two circles may have a larger area than that of the other.

As shown in FIG. 7B, the open area FM-OP may be a concave area that is concave (e.g., extending) toward a center of the optical film FM-2 on a plane surface (e.g., in a direction parallel to a planar surface of the base substrate WM-BS) defined by the outer edge FM-OE of the optical film FM-2. The open area FM-OP may have a shape corresponding to the non-deposition area TA-G.

When comparing FIG. 7A with FIG. 7B, the shapes of the open areas FM-OP may be different from each other. FIG. 7A shows an isolated open area FM-OP, and FIG. 7B shows a continuous open area (or non-isolated open area) FM-OP. In the case of the isolated open area, an edge that defines the open area FM-OP and an edge that defines the corresponding member (e.g., the optical film FM-2) are separated from each other, and in the case of the continuous open area, the edge that defines the open area FM-OP corresponds to a portion of the edge that defines the corresponding member.

As shown in FIG. 7B, the display device DD may further include a dam pattern DMP to change the continuous open area FM-OP to a closed area (e.g., isolated open area). The dam pattern DMP may be a synthetic resin pattern disposed on the input sensor FM-1 (refer to FIGS. 4A and 4B). The dam pattern DMP may be disposed on the same layer as the optical film FM-2 or may be removed after forming a refractive index matching pattern IMP as shown in FIGS. 9C and 9D.

The optical film FM-2 may have a multi-layer structure. The multi-layer structure may include at least one synthetic resin film, i.e., a polymer film. The synthetic resin film may form the polarizer or the retarder. The synthetic resin film may be a base layer that supports another optical coating layer. The multi-layer structure may include at least an adhesive layer.

As shown in FIG. 7C, the optical film FM-2 may include a coating layer CCL, a protective film TAC, a polyvinyl alcohol (PVA) film (i.e., a PVA film), an adhesive layer OCA, a first phase retardation layer $\lambda/2$RL, and a second phase retardation layer $\lambda/4$RL.

The coating layer CCL may include one of a hard coating layer, an anti-reflective layer, and an anti-fingerprint layer. The PVA film is a stretching type (e.g., stretching kind) polarizer containing iodine or dichroic dye. The protective film TAC may be a tri-acetyl cellulose (TAC) film. In the present exemplary embodiment as illustrated in FIG. 7C, the optical film FM-2 in which the protective film TAC is disposed only on one surface of the PVA film is shown. However, embodiments of the present disclosure are not limited thereto or thereby.

The first phase retardation layer $\lambda/2$RL may be attached to the PVA film by the adhesive layer OCA. The second phase retardation layer $\lambda/4$RL may be attached to the first phase retardation layer $\lambda/2$RL by the adhesive layer OCA. The adhesive layer OCA, which may be adhered to the input sensor FM-1, is attached to the second phase retardation layer $\lambda/4$RL.

At least one of the first phase retardation layer $\lambda/2$RL and the second phase retardation layer $\lambda/4$RL may be a liquid crystal coating-type (e.g., coating-kind) phase retardation layer. A manufacturing method of the optical film FM-2 including the liquid crystal coating-type (e.g., coating-kind) phase retardation layer is as follows. An alignment layer is formed on a base layer, and a liquid crystal layer that implements a $\lambda/2$ phase retardation is formed on the alignment layer. Then, the liquid crystal layer is cured, the base layer is removed, and the alignment layer and the liquid crystal layer are attached to the adhesive layer OCA. An alignment layer is formed on a base layer, and a liquid crystal layer that implements a $\lambda/4$ phase retardation is formed on the alignment layer. Then, the liquid crystal layer is cured, the base layer is removed, and the alignment layer and the liquid crystal layer are attached to the adhesive layer OCA. The first phase retardation layer $\lambda/2$RL and the adhesive layer OCA are attached to the PVA film, and then, the second phase retardation layer $\lambda/4$RL and the adhesive layer OCA are attached to the first phase retardation layer $\lambda/2$RL.

The liquid crystal layer of the $\lambda/2$ phase retardation and the $\lambda/4$ phase retardation may include a reactive liquid crystal monomer (e.g., a calamitic mesogen that expresses a nematic liquid crystal phase), and the alignment layer may include polyimide or polyamide. In an embodiment, the liquid crystal layer of the $\lambda/2$ phase retardation and the $\lambda/4$ phase retardation may include a photoreactive polymer with a refractive index anisotropy. In this case, the alignment layer may be omitted (e.g., may not be included).

In the present exemplary embodiment, the first phase retardation layer $\lambda/2$RL and the second phase retardation layer $\lambda/4$RL may be a constant distribution phase retardation layer whose phase difference decreases as a wavelength increases.

As shown in FIG. 7D, the optical film FM-2 may include an inverse distribution $\lambda/4$ phase retardation layer $\lambda/4$RL that replaces the constant distribution $\lambda/2$ phase retardation layer $\lambda/2$RL and $\lambda/4$ phase retardation layer $\lambda/4$RL. The inverse distribution $\lambda/4$ phase retardation layer may be a film type (e.g., film kind) phase retardation layer or a liquid crystal coating-type (e.g., coating-kind) phase retardation layer.

Also, a liquid crystal coating-type (e.g., coating-kind) polarizer may include an O-type polarizing layer, in which a liquid crystal composition containing a dichroic substance and a liquid crystal compound is aligned in a certain direction, and an E-type polarizing layer in which a lyotropic liquid crystal is aligned in a certain direction. The polarizer may be aligned on the protective film TAC. In this case, the protective film TAC corresponds to the base layer.

Figure 8A:
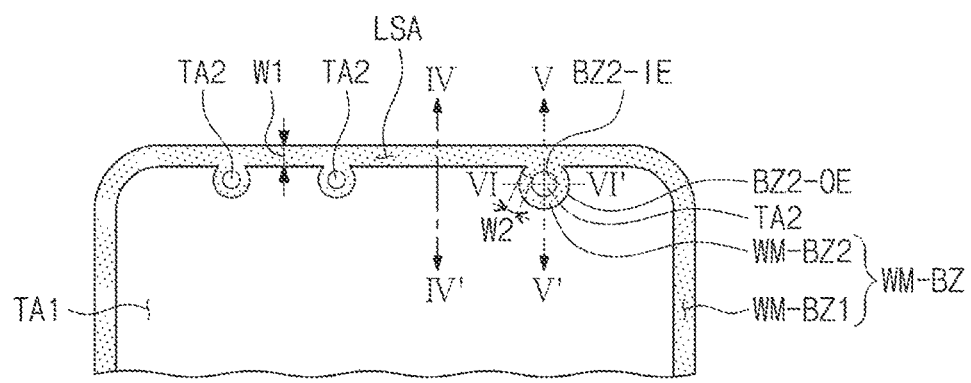
FIG. 8A is a plan view showing a portion of a window according to an exemplary embodiment of the present disclosure.
Figure 8B:
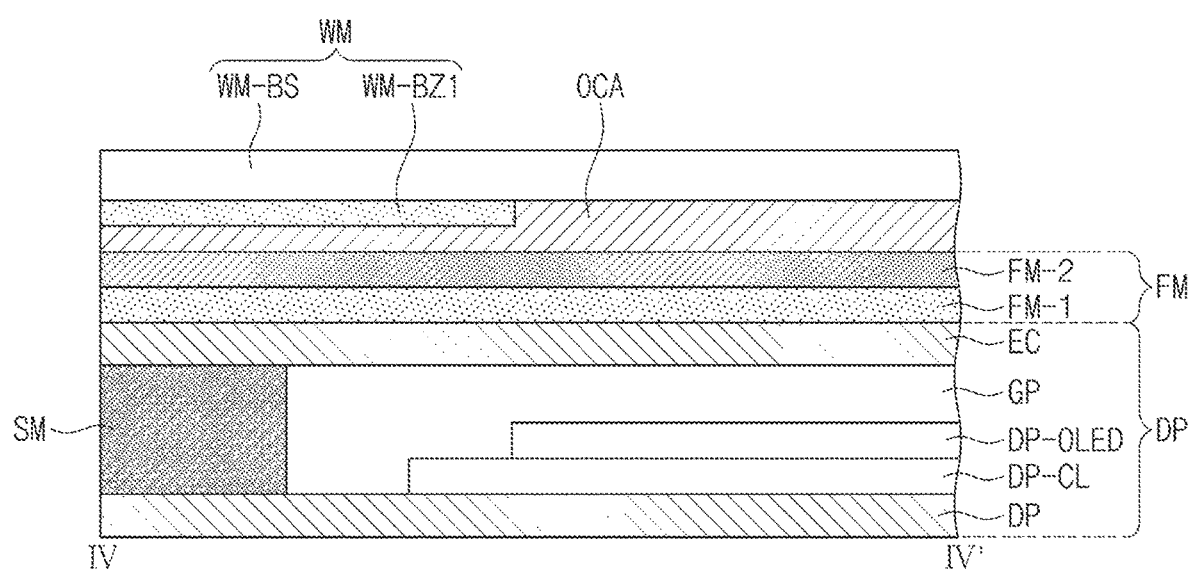
Figure 8C:
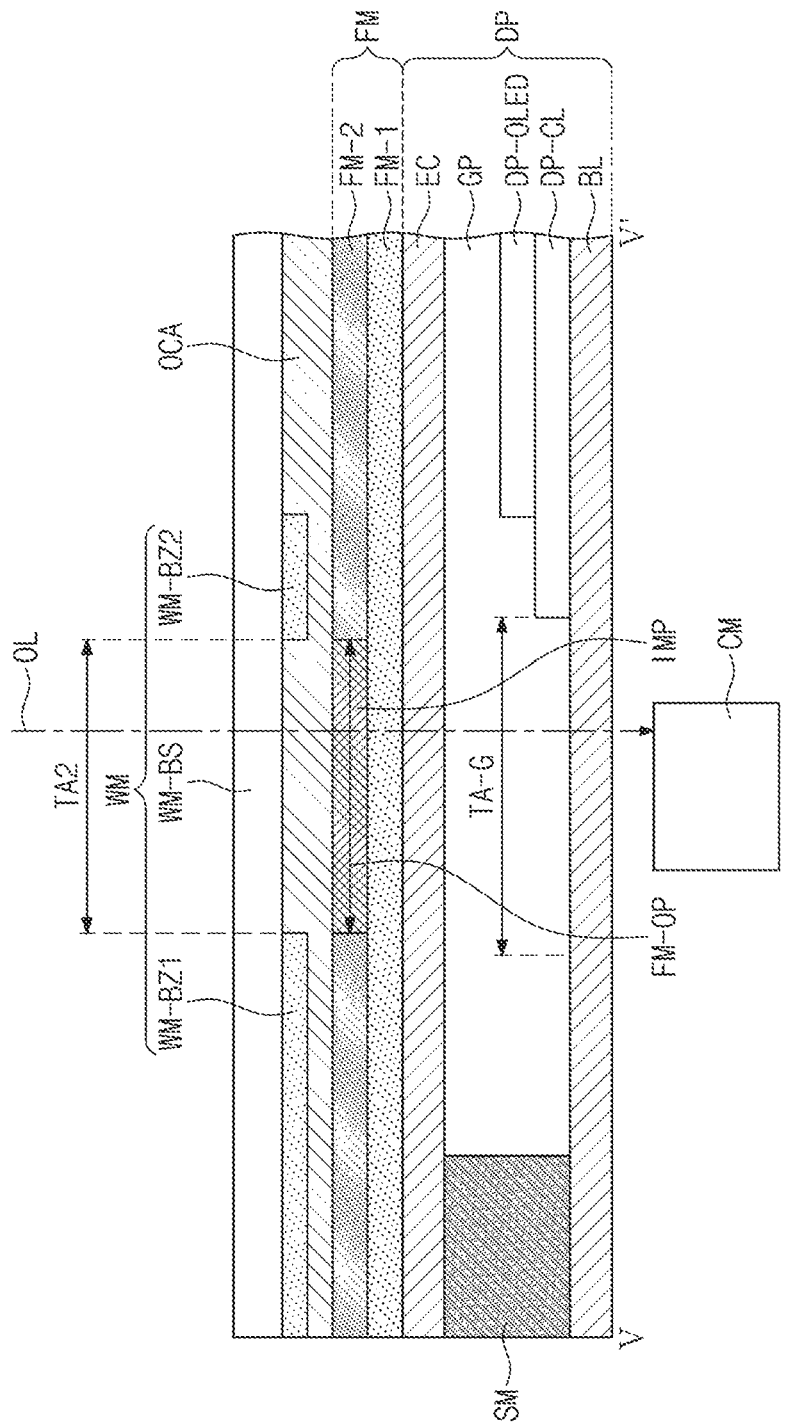

FIG. 8A is a plan view showing a portion of a window WM according to an exemplary embodiment of the present disclosure. FIGS. 8B-8D are cross-sectional views showing a display device DD according to an exemplary embodiment of the present disclosure. FIGS. 8B, 8C, and 8D show cross-sectional views taken along the lines IV-IV', V-V', and VI-VI' of FIG. 8A, respectively. Hereinafter, detailed descriptions of the same configurations as those described with reference to FIGS. 1-7D may be omitted (e.g., may not be repeated).

Referring to FIGS. 8A and 8B, the first pattern WM-BZ1 overlaps with the sealing member SM in a plan view (e.g., in a direction normal to the base substrate WM-BS). The first pattern WM-BZ1 may substantially completely cover the sealing member SM. The second pattern WM-BZ2 may include a curved area in the plan view. A width W2 of the second pattern WM-BZ2 may be equal to or smaller than about 70% of a width W1 of the first pattern WM-BZ1. The width W1 of the first pattern WM-BZ1 may be in a range of about 0.5 mm to about 2 mm, and the width W2 of the second pattern WM-BZ2 may be in a range of about 0.2 mm to about 0.8 mm.

The inner edge BZ2-IE of the second pattern WM-BZ2, which defines the second transmissive area TA2, may substantially define a circle. The outer edge BZ2-OE of the second pattern WM-BZ2 may substantially define a portion of a circle. A center of the circle defined by the inner edge BZ2-IE and a center of the circle defined by the outer edge BZ2-OE may coincide with each other.

As shown in FIGS. 8A and 8B, a portion of the circuit element layer DP-CL may overlap with the first pattern WM-BZ1. Signal lines may be disposed on the circuit element layer DP-CL that overlaps with the first pattern WM-BZ1. Circuit patterns that form the driving circuit GDC shown in FIG. 5B may be disposed on the circuit element layer DP-CL that overlaps with the first pattern WM-BZ1. The circuit patterns include a transistor, a capacitor, and a signal line. The display element layer DP-OLED, for example, the light emitting devices, do not overlap with the first pattern WM-BZ1.

As shown in FIGS. 8C and 8D, the base layer BL and the encapsulation substrate EC overlap with the second pattern WM-BZ2 and the second transmissive area TA2. Because the open area is not formed in the base layer BL and the encapsulation substrate EC, the display element layer DP-OLED may be firmly (e.g., well) protected from external moisture.

At least one of the display element layer DP-OLED and the circuit element layer DP-CL may not overlap with the second transmissive area TA2. In the present exemplary embodiment, the circuit element layer DP-CL may not overlap with the second transmissive area TA2. A portion of the circuit element layer DP-CL may overlap with the second pattern WM-BZ2. The signal lines may be disposed on the portion of the circuit element layer DP-CL, which overlaps with the second pattern WM-BZ2.

In the present exemplary embodiment, the display element layer DP-OLED does not overlap with the second transmissive area TA2. A portion of the display element layer DP-OLED may overlap with the second pattern WM-BZ2.

The open area FM-OP of the optical film FM-2 corresponds to the second transmissive area TA2. The open area FM-OP may prevent or substantially prevent the optical signal from being lost by the polarizer and/or the retarder. For instance, the camera module CM may receive an external light OL through the second transmissive area TA2. Because structures that decrease the light transmittance are removed from a light traveling path, an operational reliability of the camera module CM may be improved.

When an air gap is formed in the open area FM-OP of the optical film FM-2, the optical signal may be lost due to a difference in refractive index between the air gap and the adhesive layer OCA on a surface of the adhesive layer OCA or between the air gap and the input sensor FM-1 on a surface of the input sensor FM-1. The loss of the optical signal may mostly be caused by reflection.

The refractive index matching pattern IMP is disposed in the open area FM-OP of the optical film FM-2 to decrease the loss of the optical signal. The refractive index matching pattern IMP may have a refractive index of about 90% to about 110% of the refractive index of the adhesive layer OCA. For example, the refractive index matching pattern IMP may have a refractive index of about 95% to about 105% of the refractive index of the adhesive layer OCA.

The refractive index of the adhesive layer OCA may be in a range of about 1.46 to about 1.49. The refractive index of the refractive index matching pattern IMP may be in a range of about 1.45 to about 1.52. The base substrate WM-BS may have a refractive index of about 1.48 to about 1.50 to decrease a reflectance at an interface between the adhesive layer OCA and the base substrate WM-BS.

The refractive index matching pattern IMP may include a synthetic resin, e.g., a silicone resin, a urethane resin, an epoxy resin, or an acryl resin. However, a material for the refractive index matching pattern IMP is not limited thereto or thereby. The refractive index matching pattern IMP containing the synthetic resin may be defined as a synthetic resin pattern.

According to the present exemplary embodiment, the loss of light may be reduced, and a defect in which air in the air gap penetrates into the adhesive layer OCA and forms bubbles in the adhesive layer OCA may be prevented or reduced. The bubbles in the adhesive layer OCA may be recognized by the user and therefore are not desirable.

FIGS. 9A-9E are cross-sectional views showing a manufacturing method of a display device DD according to an exemplary embodiment of the present disclosure. FIGS. 9A-9E each show cross-sections corresponding to the cross-section shown in FIG. 8D.

Figure 9A:
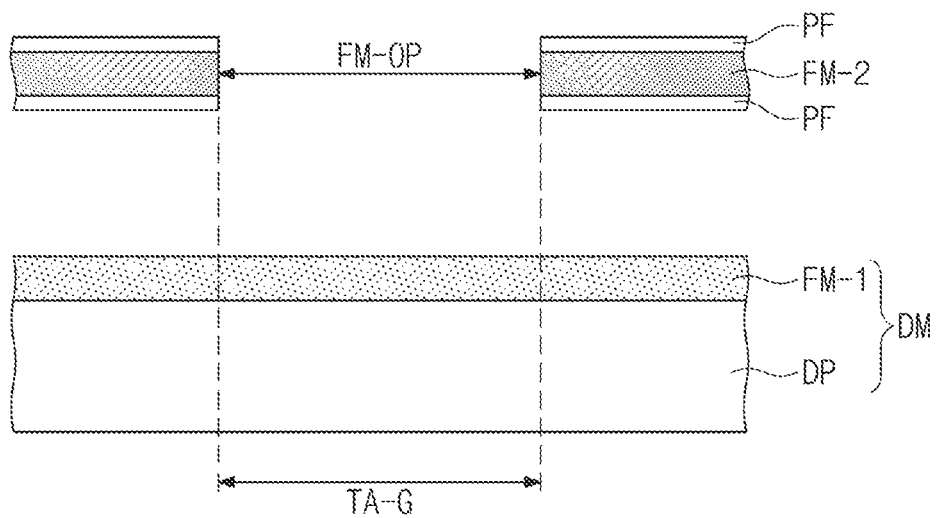
FIGS. 9A-9E are cross-sectional views showing a manufacturing method of a display device according to an exemplary embodiment of the present disclosure.

Referring to FIG. 9A, the display module DM including the display panel DP and the input sensor FM-1 is provided. In addition, the optical film FM-2 through which the open area FM-OP is defined is provided.

The optical film FM-2 is laminated on the display module DM after the non-deposition area TA-G of the display panel DP and the open area FM-OP of the optical film FM-2 are aligned with each other. FIG. 9A shows the optical film FM-2 on which release films PF are attached. The lamination method is not particularly limited.

Figure 9B:
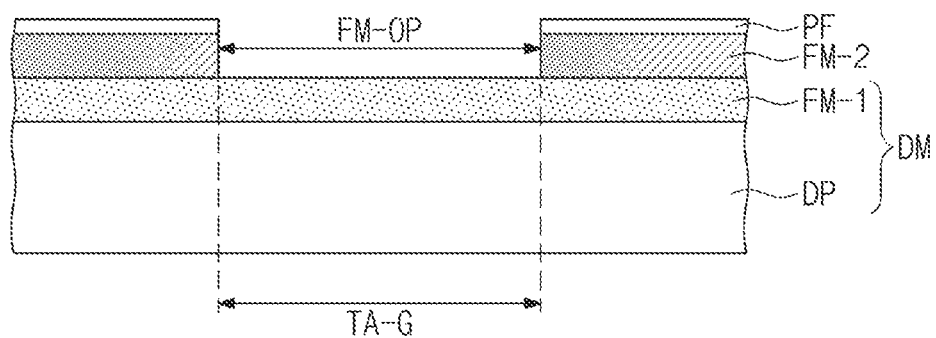
Figure 9C:
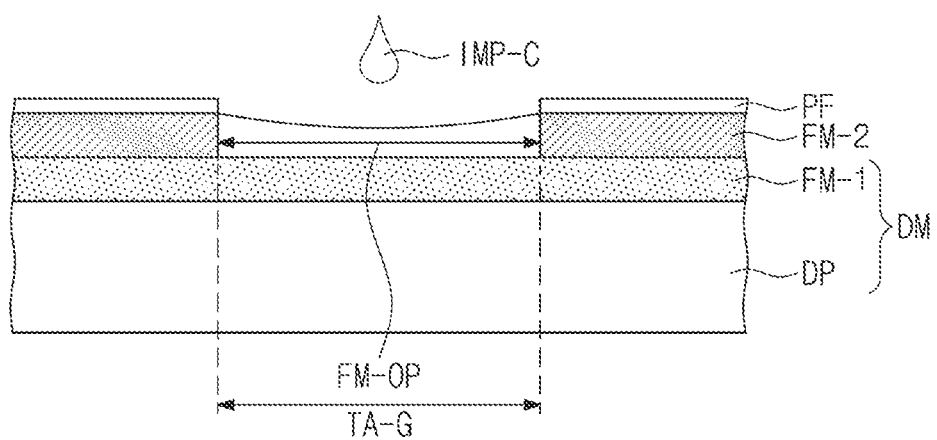
Figure 9D:
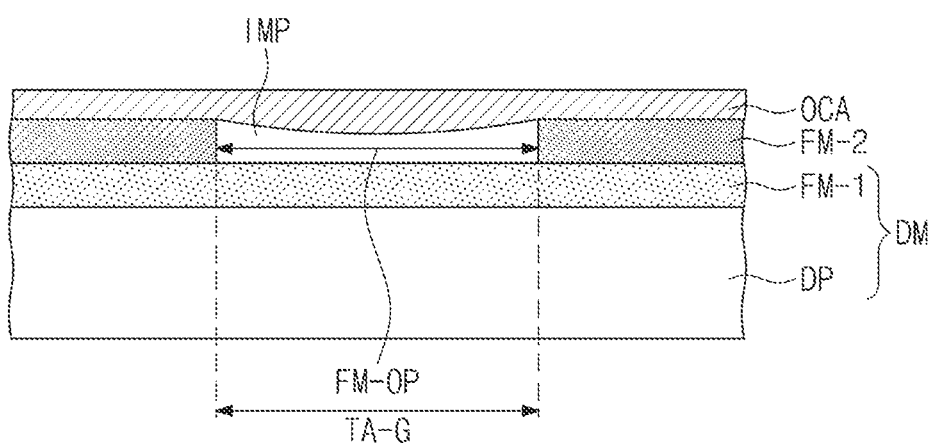

A lower release film PF is removed, and then the optical film FM-2 is laminated on the display module DM. As shown in FIG. 9B, an upper release film PF protects the optical film FM-2. In an exemplary embodiment of the present disclosure, after both of the lower and the upper release films PF are removed, the optical film FM-2 is laminated on the display module DM.

Referring to FIG. 9C, a composition IMP-C is provided in the open area FM-OP to form the refractive index matching pattern IMP. The composition IMP-C may include a base resin, a coupling agent, a photo initiator, and/or the like. The base resin may include various suitable resin compositions that are usually referred to as "binder". The composition IMP-C may be a solvent based composition containing a solvent or a solvent-free composition that does not contain the solvent.

A heat- or light-curing process is performed on the composition IMP-C provided in the open area FM-OP. One or more curing processes may be performed. A polymerization reaction between a polymer and a monomer in the composition IMP-C may proceed during the curing process.

In the case where the optical film FM-2 including the continuous open area FM-OP is provided as shown in FIG. 7B, the dam pattern DMP may be formed on the input sensor FM-1 before the refractive index matching pattern IMP is formed. The dam pattern DMP may be removed or may not be removed after the refractive index matching pattern IMP is formed.

Then, as shown in FIG. 9D, the upper release film PF is removed. In addition, the adhesive layer OCA is laminated on the optical film FM-2.

Figure 9E:
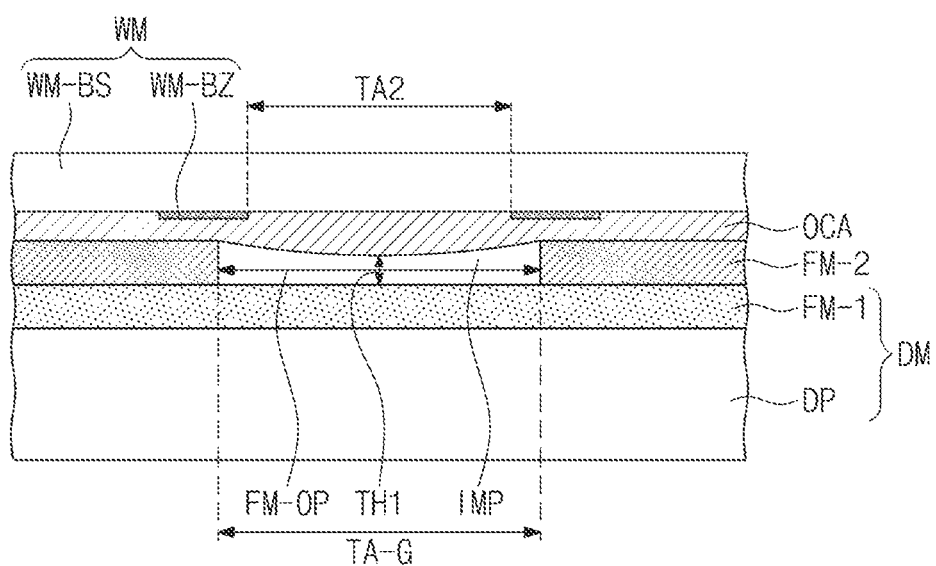

As shown in FIG. 9E, the window WM and the adhesive layer OCA may be coupled to each other. The window WM may be laminated on the adhesive layer OCA after the second transmissive area TA2 and the open area FM-OP are aligned with each other.

Referring to FIG. 9E, an upper surface of the refractive index matching pattern IMP may have a concave curved surface (e.g., a curved surface with a concave shape). A thickness TH1 of the refractive index matching pattern IMP may be about 50% to about 100% of a thickness of the optical film FM-2. The thickness TH1 of the thinnest portion of the refractive index matching pattern IMP may be about 50% of the thickness of the optical film FM-2. The thickness of the optical film FM-2 may be in a range of about 100 μm to about 150 μm.

The thickness TH1 of the refractive index matching pattern IMP may be about 50% to about 100% of a thickness of the adhesive layer OCA. The thickness of the adhesive layer OCA is measured at an area that overlaps with the optical film FM-2. The thickness of the adhesive layer OCA may be in a range of about 100 μm to about 150 μm. The adhesive layer OCA may be pressed in the lamination process, and in this case, a space defined by the concave upper surface of the refractive index matching pattern IMP is filled in by the adhesive layer OCA, and thus the air gap may be removed.

Figure 10A:
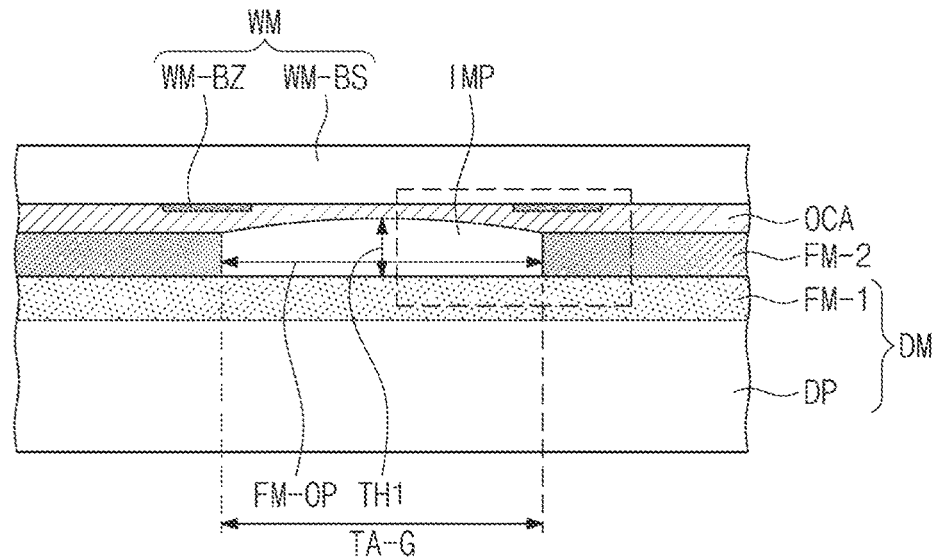
FIGS. 10A and 10B are cross-sectional views showing a display device according to an exemplary embodiment of the present disclosure.
Figure 10B:
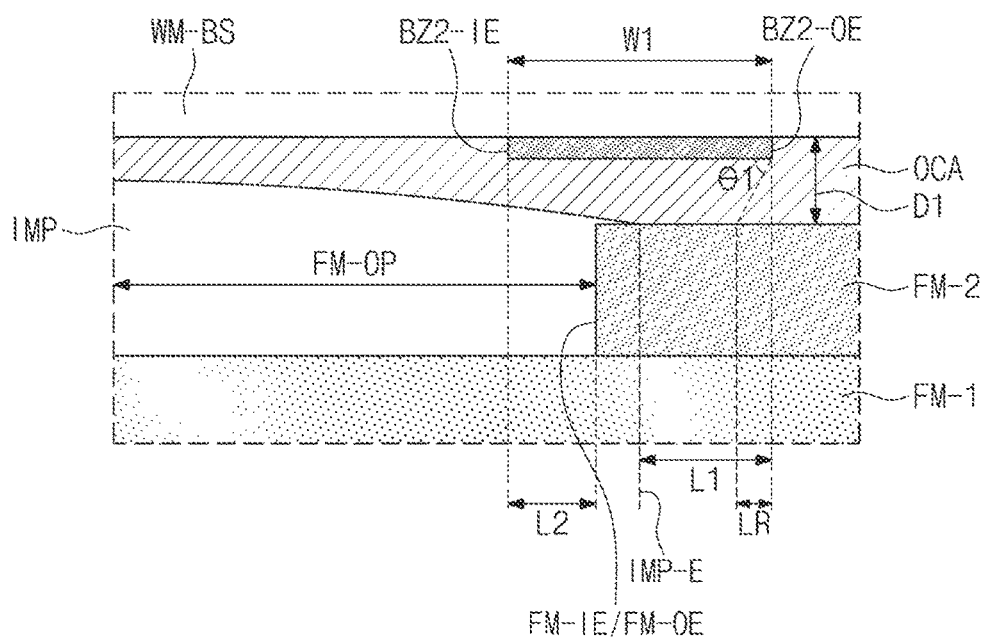

FIGS. 10A and 10B are cross-sectional views showing a display device DD according to an exemplary embodiment of the present disclosure. Hereinafter, detailed descriptions of the same configurations as those described with reference to FIGS. 9A-9E may be omitted (e.g., may not be repeated).

Different from FIG. 9E, an upper surface of a refractive index matching pattern IMP according to the present exemplary embodiment may have a convex curved surface (e.g., a curved surface with a convex shape). A thickness TH1 of the refractive index matching pattern IMP may be about 100% to about 150% of a thickness of an optical film FM-2 and may be about 100% to about 150% of a thickness of an adhesive layer OCA. The thickness TH1 of the thickest portion of the refractive index matching pattern IMP may be about 150% of the thickness of the optical film FM-2. Because the adhesive layer OCA has a relatively lower modulus of elasticity than the cured refractive index matching pattern IMP, the adhesive layer OCA may be pressed in the lamination process and may provide a flat surface.

FIG. 10B shows an arrangement relationship between an open area FM-OP of an optical film FM-2 and a second pattern WM-BZ2. The arrangement relationship described below may be applied regardless of the shape of the upper surface of the refractive index matching pattern IMP.

When a composition utilized to form the refractive index matching pattern IMP is provided in the open area FM-OP of the optical film FM-2 to overflow the open area FM-OP and cured, the refractive index matching pattern IMP has a shape shown in FIG. 10B. When viewed in a plan view (e.g., in a direction normal to the base substrate WM-BS), an edge IMP-E of the refractive index matching pattern IMP overlaps with the second pattern WM-BZ2.

The edge IMP-E of the refractive index matching pattern IMP is disposed inside the outer edge BZ2-OE when viewed in a plan view (e.g., in a direction parallel to a planar surface of the base substrate WM-BS). A distance L1 between the outer edge BZ2-OE of the second pattern WM-BZ2 and the edge IMP-E of the refractive index matching pattern IMP is larger than a reference distance LR so as not to allow the refractive index matching pattern IMP to be perceived by the user. That is, the distance L1 satisfies the following Equation 1.

$$L1 \geq \left(LR = \frac{D1}{\tan(\theta 1)}\right) \quad \text{Equation 1}$$

In Equation 1, "D1" denotes a distance between the lower surface of the base substrate WM-BS and the upper surface of the optical film FM-2, and "θ1" denotes a viewing angle of the user with respect to the optical film FM-2. "θ1" may be in a range of about 470 to about 70°, for example, in a range of about 550 to about 65°, or, in a range of about 61° to about 62°.

When viewed in a plan view, the edge (e.g., the inner edge FM-IE of the optical film FM-2 of FIG. 7A, or a portion of the outer edge FM-OE of the optical film FM-2 of FIG. 7B) of the optical film FM-2 that defines the open area FM-OP of the optical film FM-2 is disposed outside the inner edge BZ2-IE (e.g., in a direction parallel to a planar surface of the base substrate WM-BS). That is, when viewed in a plan view, the edge of the optical film FM-2 that defines the open area FM-OP of the optical film FM-2 overlaps with the second pattern WM-BZ2 (e.g., in a direction normal to the base substrate WM-BS). A distance L2 between the edge of the optical film FM-2 that defines the open area FM-OP of the optical film FM-2 and the inner edge BZ2-IE of the second pattern WM-BZ2 may be in a range of about 0 μm to about 350 μm.

Figure 11:
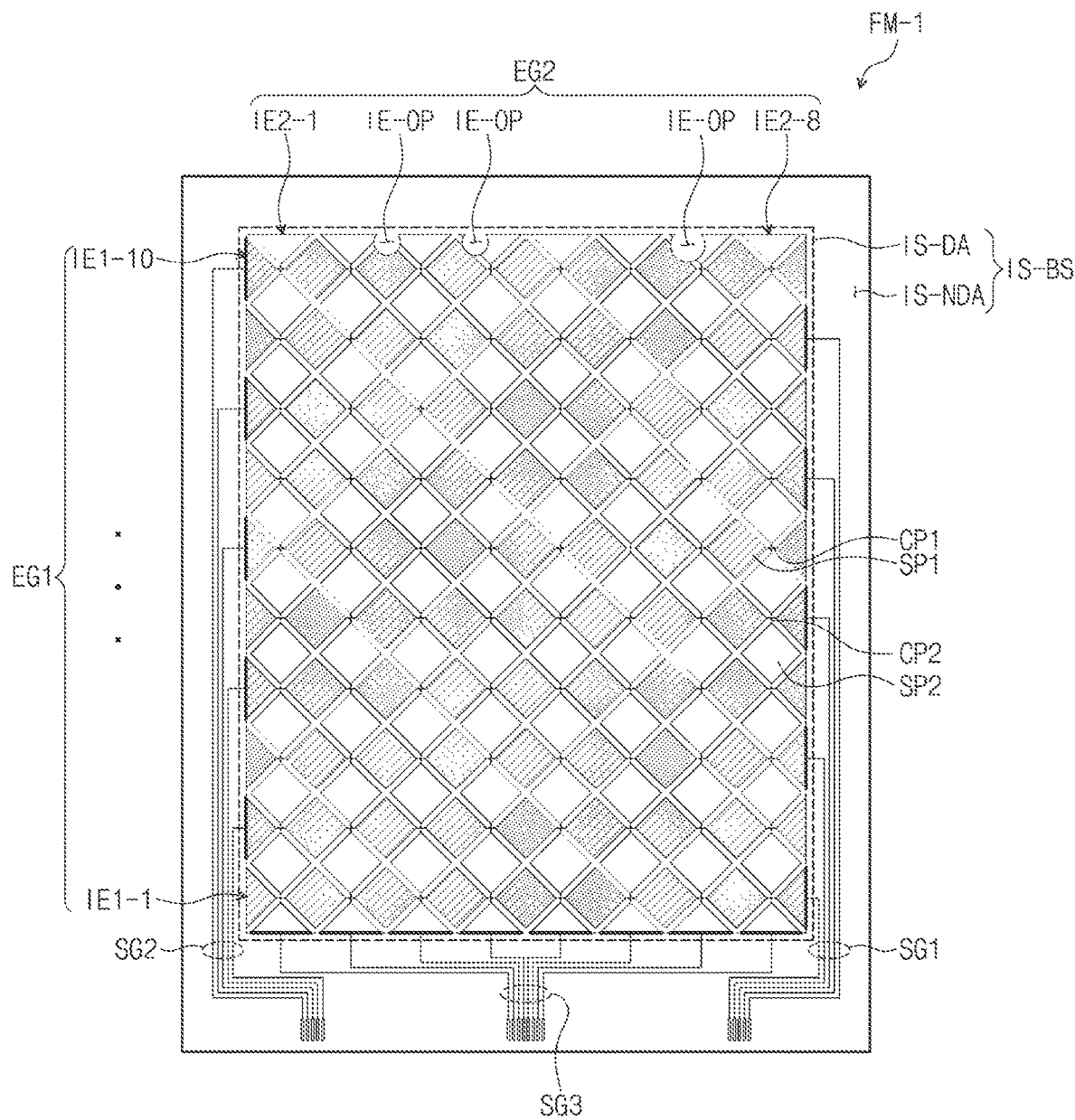
FIG. 11 is a plan view showing an input sensor according to an exemplary embodiment of the present disclosure.

FIG. 11 is a plan view showing an input sensor FM-1 according to an exemplary embodiment of the present disclosure. Hereinafter, detailed descriptions of the same configurations as those described with reference to FIGS. 1-10B may be omitted (e.g., may not be repeated).

Referring to FIG. 11, an open area IE-OP is defined in sensing electrodes to correspond to a second transmissive area TA2. In the present exemplary embodiment, three open areas IE-OP are defined in first sensing electrodes IE1-1 to IE1-10 and second sensing electrodes IE2-1 to IE2-8 as a representative example.

FIG. 11 shows a continuous open area IE-OP similar to the open area FM-OP shown in FIG. 7B. However, embodiments of the present disclosure are not limited thereto or thereby. The continuous open area IE-OP may be changed to the isolated open area IE-OP.

In an exemplary embodiment of the present disclosure, the open area IE-OP may have a shape similar to the non-deposition area TA-G shown in FIG. 5D. Conductive layers IS-CL1 and IS-CL2 and first, second, and third insulating layers IS-IL1, IS-IL2, and IS-IL3 may not be disposed in the open area IE-OP.

FIGS. 12A-12J are plan views showing a portion of a window WM according to an exemplary embodiment of the present disclosure. Different from FIG. 4C, FIGS. 12A-12J show the window WM as including one second transmissive area TA2. Hereinafter, detailed descriptions of the same configurations as those described with reference to FIGS. 1-11 may be omitted (e.g., may not be repeated). Hereinafter, an edge of a base substrate WM-BS and an outer edge BZ1-OE of a first pattern WM-BZ1 are shown to be aligned with each other on the plane surface.

Figure 12A:
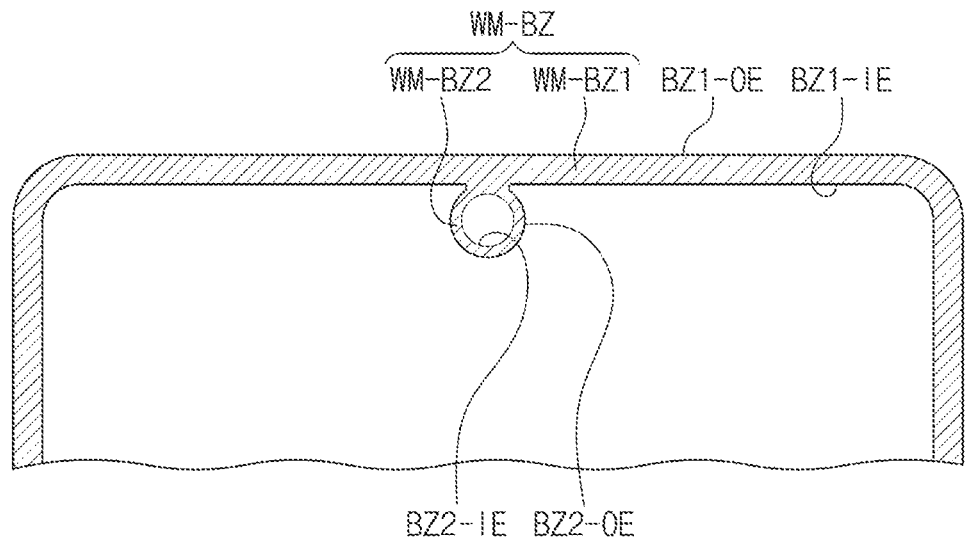
FIGS. 12A-12J are plan views showing a portion of a window according to an exemplary embodiment of the present disclosure.
Figure 12B:
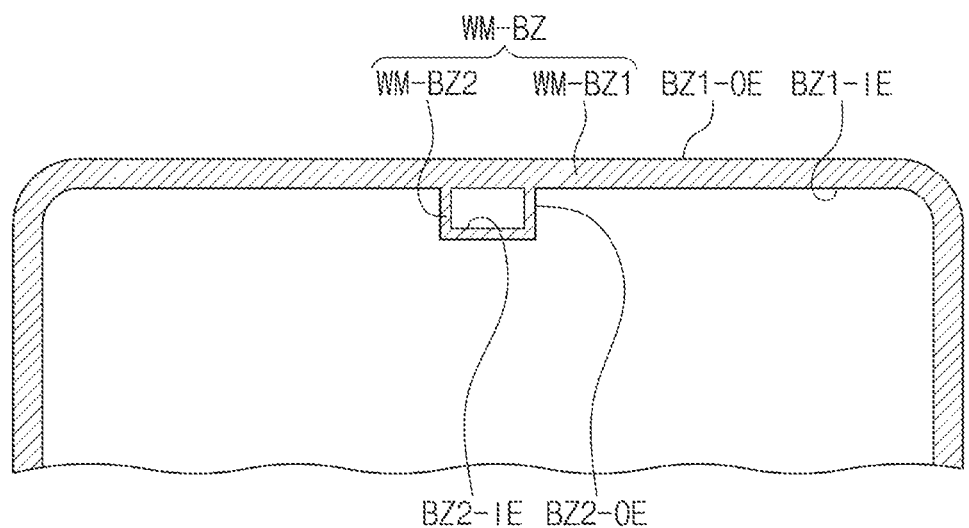

FIG. 12A shows that the second transmissive area TA2 disposed at a right side portion in FIG. 4C is disposed at a center. As shown in FIG. 12B, each of the outer edge BZ2-OE and the inner edge BZ2-IE of the second pattern WM-BZ2 may substantially define a quadrangular shape.

Figure 12C:
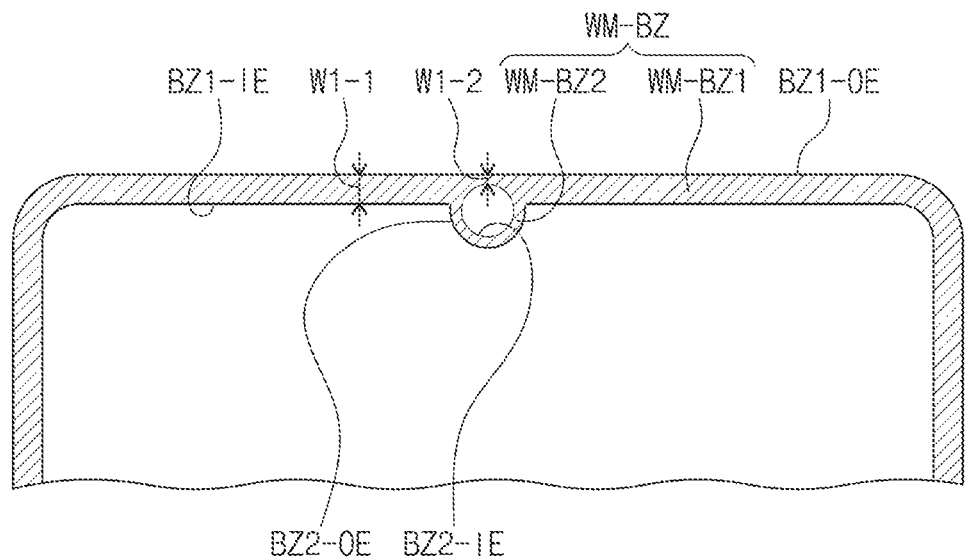
Figure 12D:
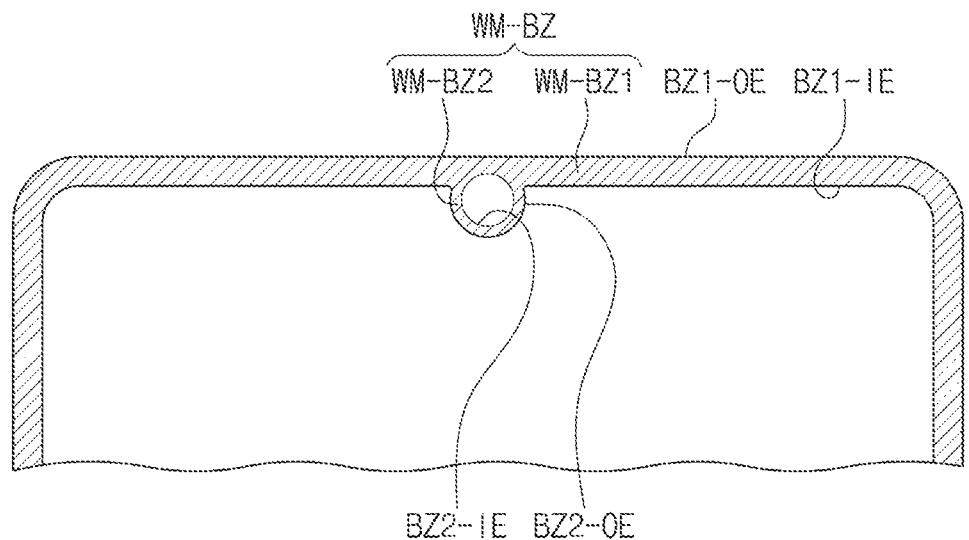
Figure 12E:
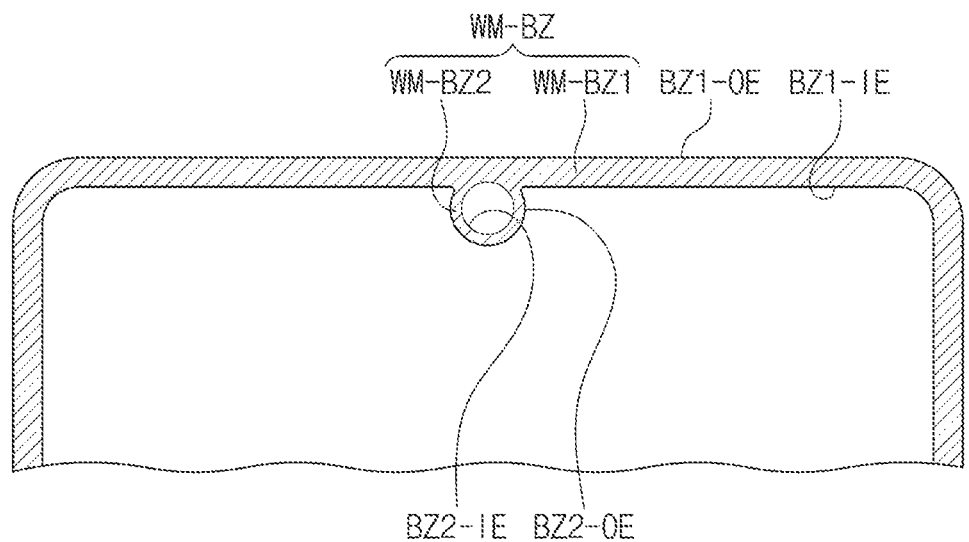

As shown in FIGS. 12C-12E, a portion of the first pattern WM-BZ1 defines the second transmissive area TA2 with the second pattern WM-BZ2. A width W1-2 of this portion of the first pattern WM-BZ1 is smaller than a width W1-1 of other portions of the first pattern WM-BZ1.

Figure 12F:
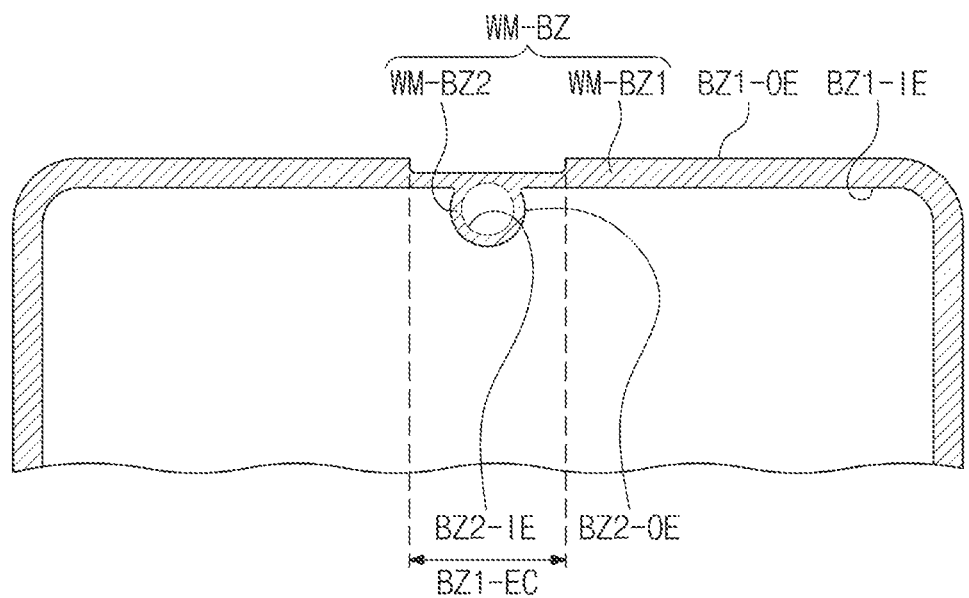

As shown in FIG. 12F, the outer edge BZ1-OE of a first pattern WM-BZ1 may include a concave area BZ1-EC toward a second pattern WM-BZ2 in a plan view (e.g., in a direction parallel to a planar surface of the base substrate WM-BS). A concave area may be defined in the edge WM-BSE of the base substrate WM-BS (refer to FIG. 4C) to correspond to the concave area BZ1-EC.

Figure 12G:
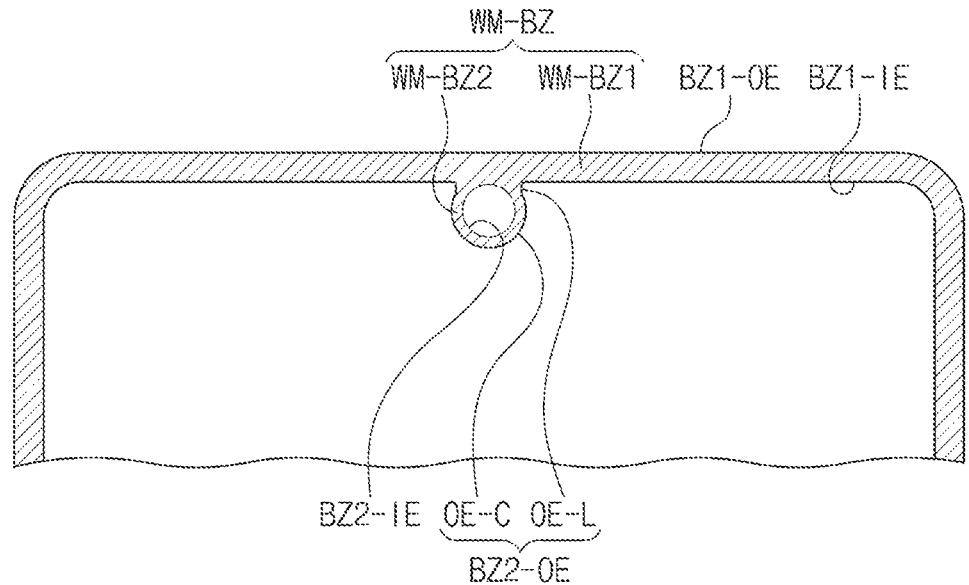

As shown in FIG. 12G, an outer edge BZ2-OE of the second pattern WM-BZ2 may include a curved portion OE-C and a straight portion OE-L in a plan view. The straight portion OE-L may be disposed in an area that connects a first pattern WM-BZ1 and the curved portion OE-C.

Figure 12H:
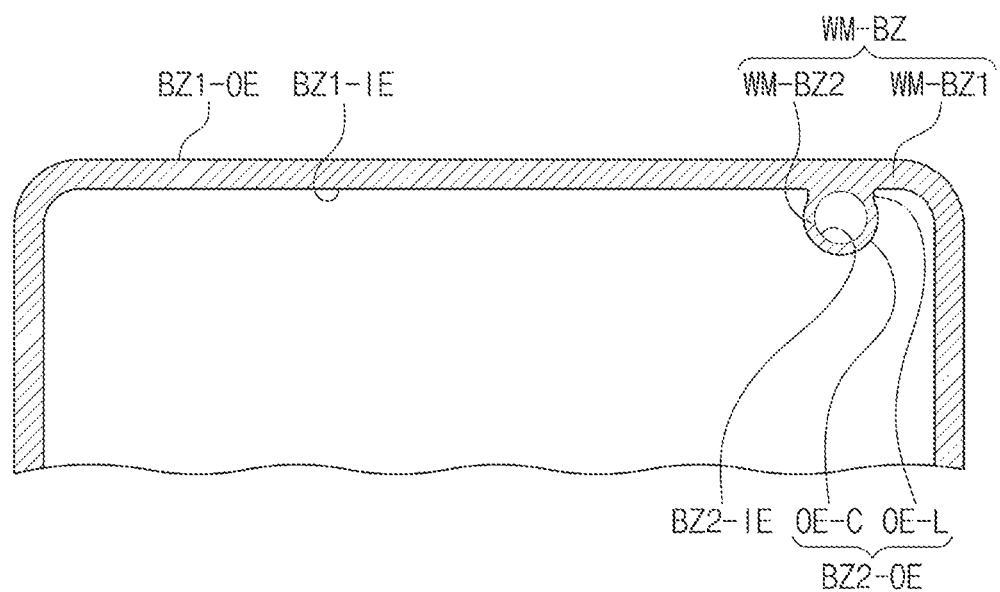

As shown in FIG. 12H, a second pattern WM-BZ2 is disposed at one side in the second direction DR2. In the present exemplary embodiment, the second pattern WM-BZ2 biased to a right side is shown as a representative example. In an exemplary embodiment of the present disclosure, a straight portion OE-L may be omitted (e.g., may not be included).

Figure 12I:
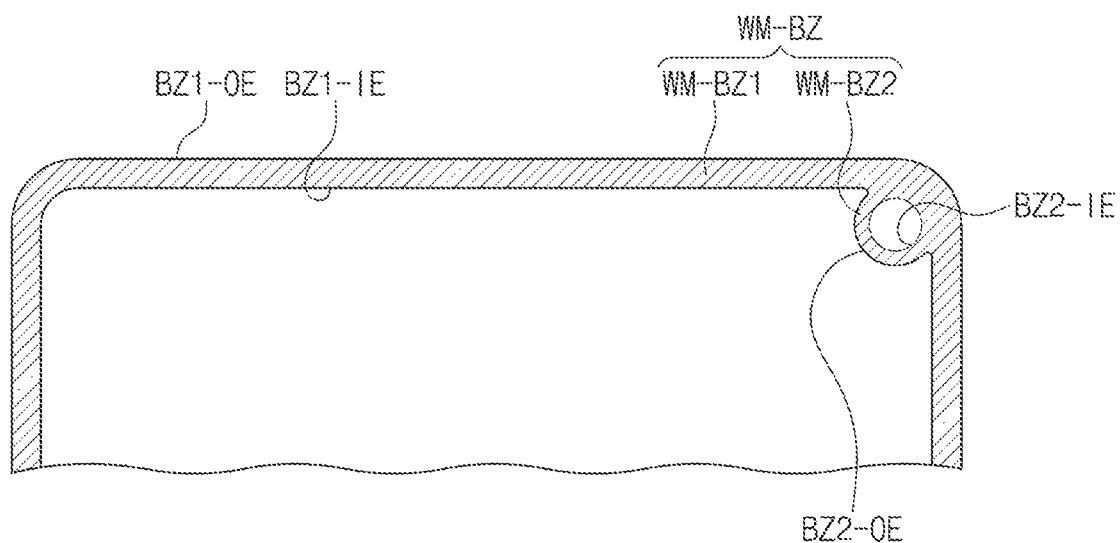

As shown in FIG. 12I, a second pattern WM-BZ2 is disposed at a corner. In the present exemplary embodiment, the second pattern WM-BZ2 disposed at a right upper corner is shown as a representative example.

Figure 12J:
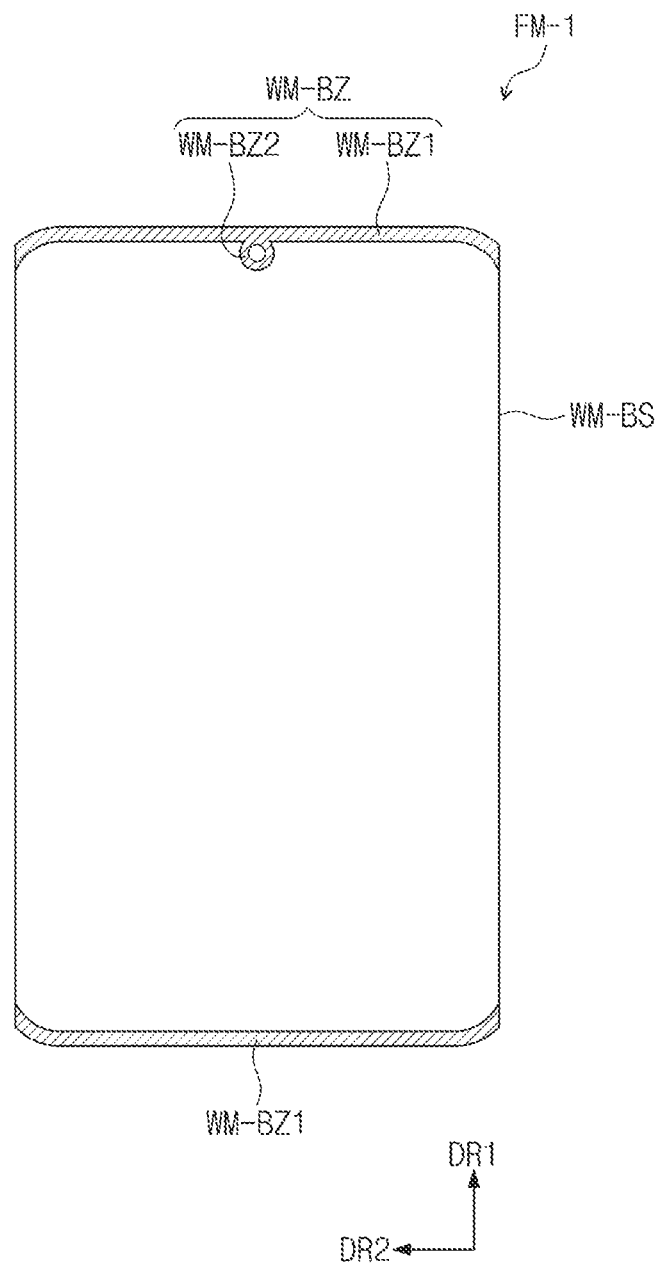

As shown in FIG. 12J, the input sensor FM-1 includes a first pattern WM-BZ1 divided into two portions. A portion disposed at an upper side in the first direction DR1 is connected to a second pattern WM-BZ2. A bezel pattern WM-BZ is not disposed at an edge of the base substrate WM-BS in the second direction DR2. Accordingly, a display area DA is widened.

Figure 13A:
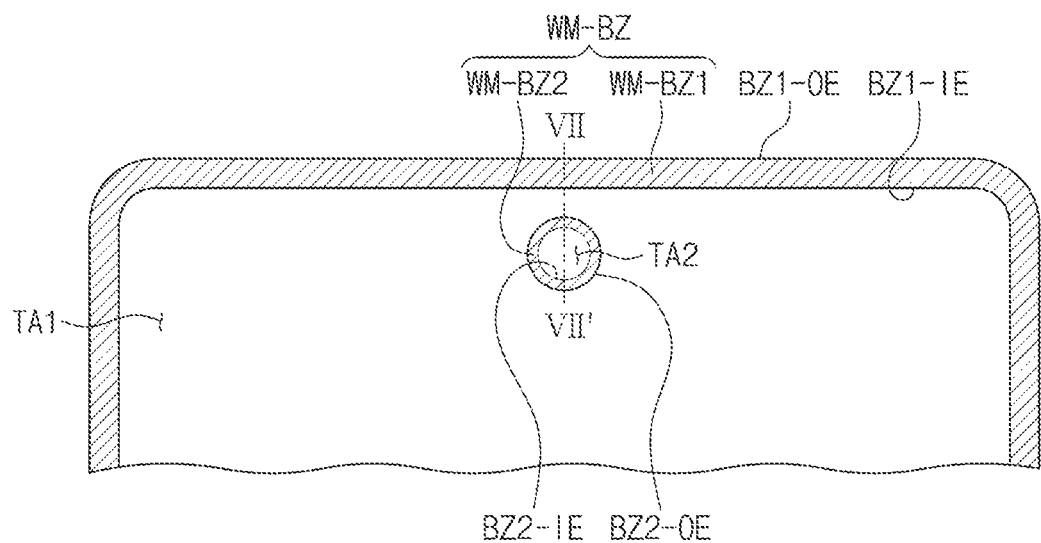
FIGS. 13A and 13B are plan views showing a portion of a window according to an exemplary embodiment of the present disclosure.
Figure 13B:
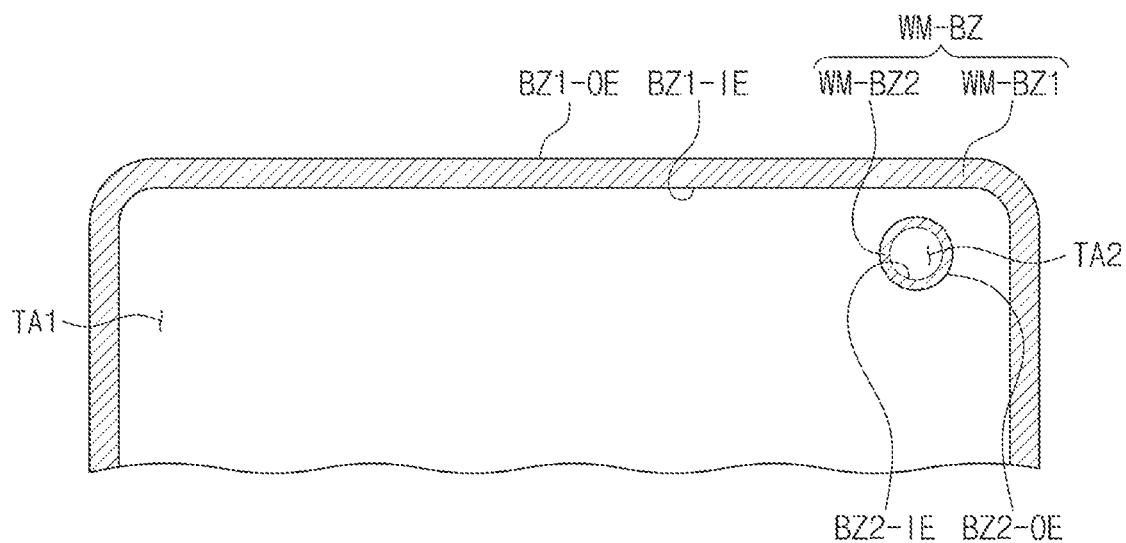
Figure 13C:
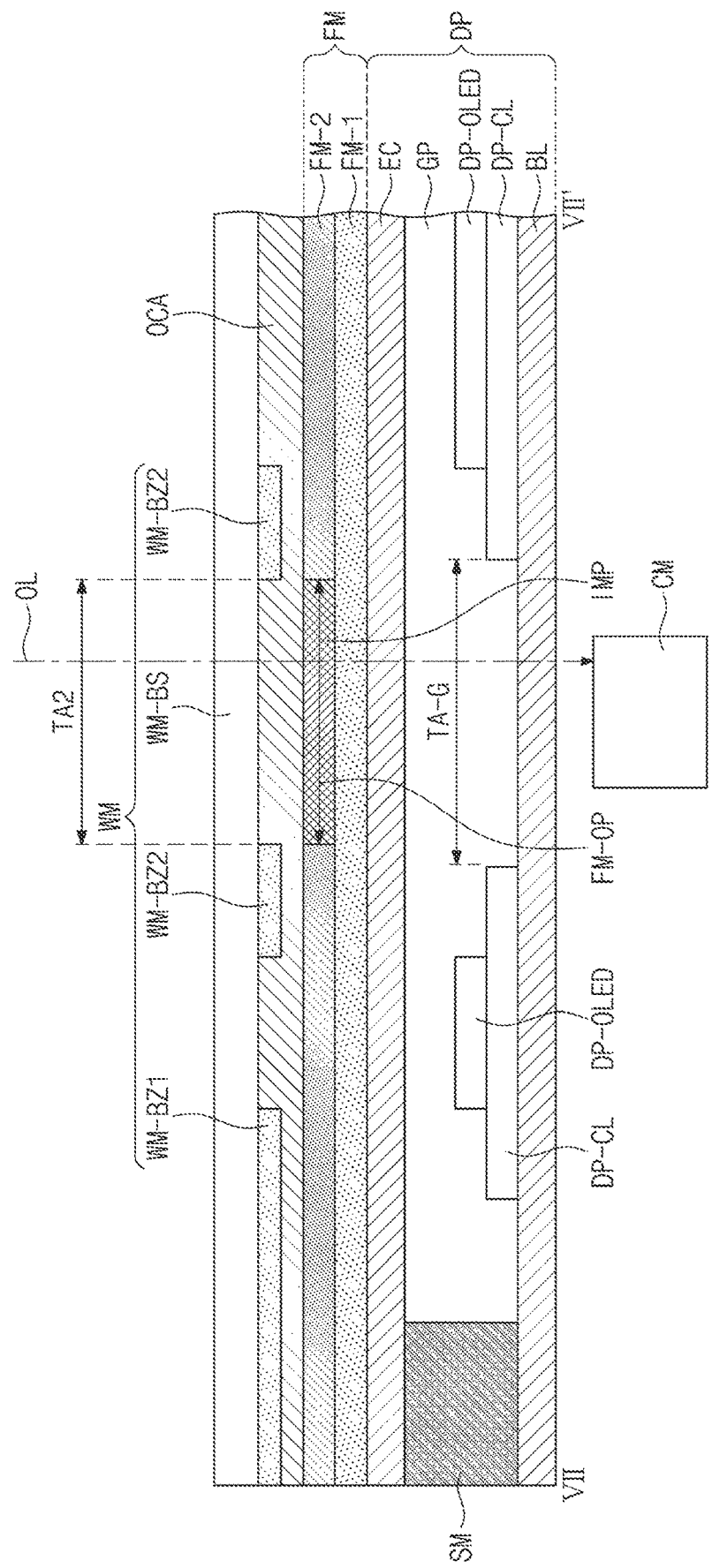
FIG. 13C is a cross-sectional view showing a display device according to an exemplary embodiment of the present disclosure.

FIGS. 13A and 13B are plan views showing a portion of a window WM according to an exemplary embodiment of the present disclosure. FIG. 13C is a cross-sectional view showing a display device according to an exemplary embodiment of the present disclosure. Hereinafter, detailed descriptions of the same configurations as those described with reference to FIGS. 1-12J may be omitted (e.g., may not be repeated).

Referring to FIGS. 13A and 13B, a first pattern WM-BZ1 that defines a first transmissive area TA1 and a second pattern WM-BZ2 that defines a second transmissive area TA2 are separated from each other. The first pattern WM-BZ1 and the second pattern WM-BZ2 are separated from each other, and the second pattern WM-BZ2 is disposed inside (e.g., the area defined by) the first pattern WM-BZ1. As shown in FIG. 13A, the second pattern WM-BZ2 may be disposed at a center in the second direction DR2, or as shown in FIG. 13B, the second pattern WM-BZ2 may be disposed to be biased to a right side in the second direction DR2. FIG. 13C shows a cross-section of the display device DD, which is taken along the line VII-VII' of FIG. 13A. A circuit element layer DP-CL and a display element layer DP-OLED are disposed between the inner edge BZ1-IE of the first pattern WM-BZ1 and the outer edge BZ2-OE of the second pattern WM-BZ2. An image may be displayed through an area between the inner edge BZ1-IE of the first pattern WM-BZ1 and the outer edge BZ2-OE of the second pattern WM-BZ2.

In an embodiment, an optical film FM-2 includes an isolated open area FM-OP as shown in FIG. 7A. The non-deposition area TA-G of the display panel DP shown in FIG. 5D has the same shape as the isolated open area FM-OP.

Figure 14A:
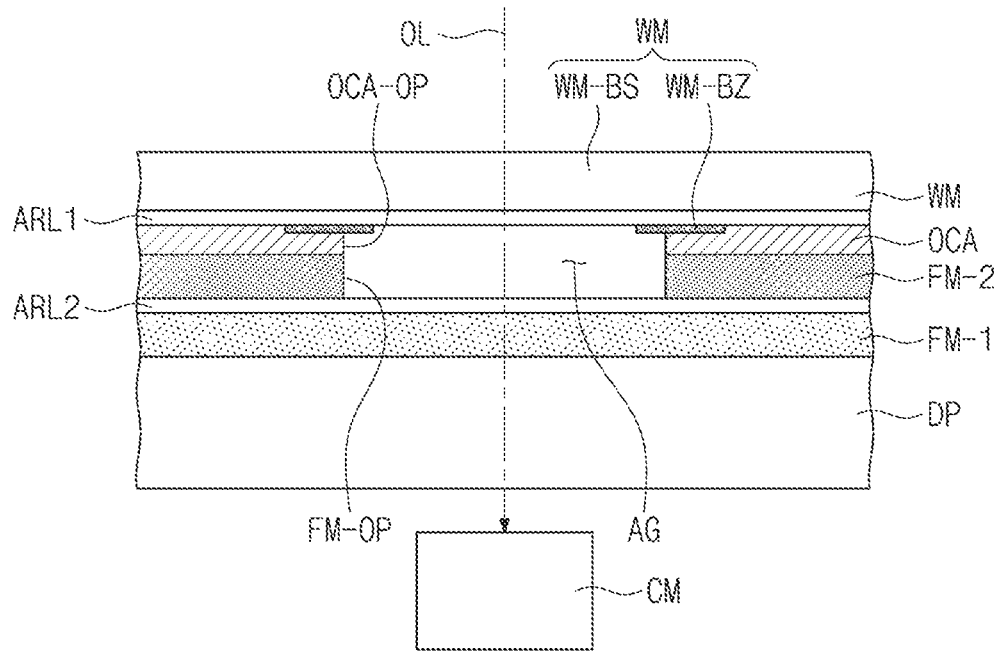
FIGS. 14A and 14B are cross-sectional views showing a display device according to an exemplary embodiment of the present disclosure.
Figure 14B:
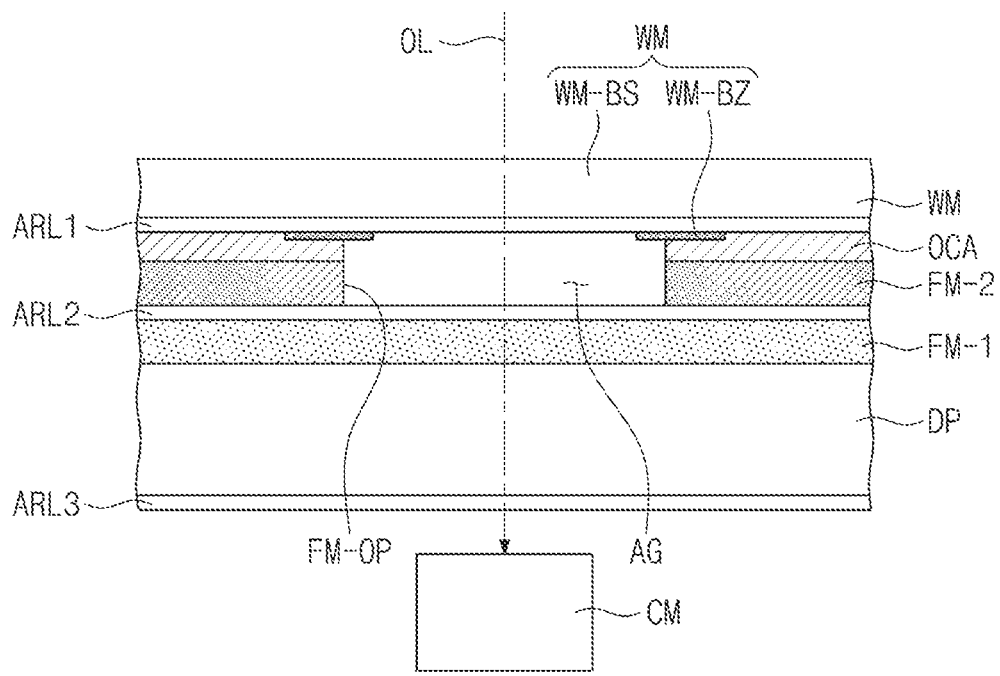

FIGS. 14A and 14B are cross-sectional views showing a display device DD according to an exemplary embodiment of the present disclosure. FIG. 14C is a cross-sectional view showing anti-reflective layers AR according to an exemplary embodiment of the present disclosure. FIGS. 14A and 14B show the cross-section corresponding to that of FIG. 10A.

Referring to FIGS. 14A and 14B, an air gap AG is formed in an open area FM-OP of an optical film FM-2. In the present exemplary embodiment, an open area OCA-OP corresponding to the open area FM-OP of the optical film FM-2 is formed in an adhesive layer OCA. However, embodiments of the present disclosure are not limited thereto or thereby. The open area OCA-OP may not be formed in the adhesive layer OCA.

The display device according to the present exemplary embodiment includes at least one anti-reflective layer to prevent or reduce the loss of the optical signal due to the air gap AG. The anti-reflective layer is disposed on at least one of a lower surface of the display module, an upper surface of the display module, and a lower surface of the window, and overlaps with the open area when viewed in a plan view (e.g., in a direction normal to the base substrate WM-BS).

As shown in FIG. 14A, a first anti-reflective layer ARL1 is disposed on a lower surface of a base substrate WM-BS, and a second anti-reflective layer ARL2 is disposed at an upper surface of an input sensor FM-1. The upper surface of the input sensor FM-1 may be the upper surface of the third insulating layer IS-IL3 shown in FIG. 6A.

As shown in FIG. 14B, a third anti-reflective layer ARL3 may be further disposed on the lower surface of the display panel DP. The lower surface of the display panel DP may be the lower surface of the base layer BL shown in FIG. 5A.

The first to the third anti-reflective layers ARL1 to ARL3 may each include a plurality of thin layers. Lights reflected from consecutive two thin layers from among the thin layers interfere with each other and disappear (e.g., result in a destructive interference). The thin layers may include a plurality of first inorganic layers having a first refractive index and a plurality of second inorganic layers having a second refractive index different from the first refractive index and alternately stacked with the first inorganic layers.

FIG. 14C shows the first anti-reflective layer ARL1 as a representative example. FIG. 14C shows three stack structures as a representative example. As shown in FIG. 14C, the first anti-reflective layer ARL1 may include one of a silicon nitride layer, a silicon oxynitride layer, and a silicon oxide layer as the first inorganic layer and may include another one of the silicon nitride layer, the silicon oxynitride layer, and the silicon oxide layer as the second inorganic layer.

FIG. 14C shows a stack structure including two silicon nitride layers and two silicon oxide layers alternately stacked with the silicon nitride layers. First to third layers SL1 to SL3 of each of the three first anti-reflective layers ARL1 may include the same material and the same thickness. However, embodiments of the present disclosure are not limited thereto or thereby. That is, first to third layers SL1 to SL3 of each of the three first anti-reflective layers ARL1 may be selected to be different from each other.

Each of a first silicon nitride layer SL1 closest to a lower surface CP-LS and a first silicon oxide layer SL2 adjacent to the first silicon nitride layer SL1 may have a thickness of about 200 angstroms (20 nanometers). A second silicon nitride layer SL3 adjacent to the first silicon oxide layer SL2 may have a thickness of about 900 angstroms (90 nanometers). The three first anti-reflective layers ARL1 include a second silicon oxide layer SL4 of different thicknesses. The reflectance may vary depending on the thickness of the second silicon oxide layer SL4.

The above-described anti-reflective layer may be applied to the display device DD in which the air gap is not formed as described with reference to FIGS. 1-13C. The reflective amount at an interface (e.g., an interface between the refractive index matching pattern IMP and the base substrate WM-BS or an interface between the refractive index matching pattern IMP and the input sensor FM-1) of the stack structures may be reduced, and thus the transmittance of the optical signal may be improved.

According to the above, the relatively large display area and the relatively small non-display area may be provided. Because the open area is not physically formed in the adhesive layer, the display panel, or the input sensor, a mis-alignment does not occur between the open areas.

The refractive index matching pattern in the open area of the optical film may prevent or reduce the loss of the optical signal. This is because the transmittance of the optical signal may increase by reducing the reflectance of the light passing through the display panel, the optical film, and the adhesive layer.

The anti-reflective layer may further increase the transmittance of the optical signal. When the open area is provided as an empty space, the anti-reflective layer may decrease the light reflection between the empty space and the adhesive layer.

Although the exemplary embodiments of the present disclosure have been described, it is understood that the present disclosure is not limited to these exemplary embodiments but various changes and modifications can be made by one ordinary skilled in the art within the spirit and scope of the present disclosure as hereinafter claimed.

Therefore, the disclosed subject matter is not limited to any single embodiment described herein, and the scope of the present inventive concept shall be determined according to the attached claims, and equivalents thereof.

What is claimed is:

1. A display device comprising:
   a display panel comprising a first area on which a light emitting element is located and a second area on which no light emitting element is located;
   a window on the display panel;
   an optical film between the window and the display panel, the optical film having a first opening overlapping the second area and passed through the optical film;
   an adhesive layer coupling the window and the optical film; and
   a synthetic resin pattern in the first opening,
   wherein an upper surface of the synthetic resin pattern is a curved surface having a convex shape or a concave shape.

2. The display device of claim 1, wherein the first area has a surface area larger than a surface area of the second area.

3. The display device of claim 1, wherein the second area is to transmit a natural light incident thereto from an outside or an infrared light reflected by an external object.

4. The display device of claim 1, wherein the optical film comprises a polarizer.

5. The display device of claim 1, wherein the window has a refractive index of about 1.48 to about 1.50, the adhesive layer has a refractive index of about 1.46 to about 1.49, and the synthetic resin pattern has a refractive index of about 1.45 to about 1.52.

6. The display device of claim 1, wherein the synthetic resin pattern comprises at least one selected from a silicone resin, a urethane resin, an epoxy resin, and an acryl resin.

7. The display device of claim 1, wherein the synthetic resin pattern has a thickness of about 50% to about 150% of a thickness of the optical film.

8. The display device of claim 7, wherein the thickness of the synthetic resin pattern is in a range of about 50% to about 150% of a thickness of the adhesive layer.

9. The display device of claim 7, wherein the synthetic resin pattern has a refractive index of about 90% to about 110% of a refractive index of the adhesive layer.

10. The display device of claim 1, wherein the display panel comprises at least one insulating layer, and
    a second opening corresponding to the first opening is defined in the at least one insulating layer.

11. The display device of claim 1, further comprising an input sensor directly on an upper surface of the display panel.

12. A display device comprising:
    a display panel comprising a first area on which a light emitting element is located and a second area on which no light emitting element is located;
    a window on the display panel;
    an optical film between the window and the display panel, the optical film having a first opening overlapping the second area and passed through the optical film;
    an adhesive layer coupling the window and the optical film;
    a synthetic resin pattern in the first opening, and
    an input sensor directly on an upper surface of the display panel,
    wherein the input sensor comprises a sensing electrode and a signal line connected to the sensing electrode, and
    a second opening corresponding to the first opening is defined in the sensing electrode.

13. The display device of claim 1, further comprising an anti-reflective layer on at least one of an upper surface of the display panel or a lower surface of a base substrate.

14. A display device comprising:
    a display panel comprising a first area and a second area having a transmittance higher than a transmittance of the first area;
    a window on the display panel;
    an optical film between the window and the display panel, the optical film having an opening overlapping the second area and passed through the optical film;
    an adhesive layer coupling the window and the optical film; and
    a synthetic resin pattern in the opening,
    wherein an upper surface of the synthetic resin pattern is a curved surface having a convex shape or a concave shape.

15. The display device of claim 14, wherein at least one of a transistor or a light emitting diode is located in the first area and the at least one of the transistor or the light emitting diode is not located in the second area.

16. The display device of claim 14, wherein the synthetic resin pattern has a refractive index of about 90% to about 110% of a refractive index of the adhesive layer.

* * * * *